United States Patent
Shroff et al.

(10) Patent No.: US 8,601,430 B1
(45) Date of Patent: Dec. 3, 2013

(54) DEVICE MATCHING TOOL AND METHODS THEREOF

(75) Inventors: Mehul D. Shroff, Austin, TX (US); Douglas M. Reber, Austin, TX (US); Edward O. Travis, Austin, TX (US)

(73) Assignee: Freescale Semiconductor, Inc., Austin, TX (US)

(\*) Notice: Subject to any disclaimer, the term of this patent is extended or adjusted under 35 U.S.C. 154(b) by 0 days.

(21) Appl. No.: 13/596,337

(22) Filed: Aug. 28, 2012

(51) Int. Cl.
*G06F 17/50* (2006.01)

(52) U.S. Cl.
USPC .......................... 716/137; 716/100

(58) Field of Classification Search
USPC ................................. 716/110–115
See application file for complete search history.

(56) References Cited

U.S. PATENT DOCUMENTS

| | | | |
|---|---|---|---|
| 6,661,638 B2 | 12/2003 | Jackson et al. | |
| 7,353,475 B2 | 4/2008 | White et al. | |
| 7,367,008 B2 | 4/2008 | White et al. | |
| 7,506,277 B1 | 3/2009 | Arora et al. | |
| 7,565,638 B2 * | 7/2009 | Hoerold | 716/106 |
| 7,665,054 B1 | 2/2010 | Gopalakrishnan et al. | |
| 2005/0010905 A1 * | 1/2005 | Noirot-Nerin | 717/121 |

OTHER PUBLICATIONS

U.S. Appl. No. 13/466,642, filed May 8, 2012, entitled "Mismatch Verification Device and Methods Thereof".
Non-Final Office Action mailed Dec. 7, 2012 for U.S. Appl. No. 13/466,642, 10 pages.

\* cited by examiner

*Primary Examiner* — Binh Tat

(57) ABSTRACT

A method includes identifying at a first instantiation of a device design and a second instantiation of the device design, determining a first value of an electrical performance characteristic of the first instantiation and a second value of the electrical performance characteristic of the second instantiation, determining that the first instantiation matches the second instantiation, wherein the determining is based on the first value, the second value, and a tolerance, and in response to determining that the first and second instantiations do not match, then identifying a first feature of the first instantiation and changing the first feature of the first instantiation.

20 Claims, 19 Drawing Sheets

| | |
|---|---|
| 100pF | FRINGE CAPACITOR CELL |

802 →

LIBRARY: STANDARD_CELL

CELL NAME: 100pF_FRINGE_Cap

LOCATION: X: TBD    Y: TBD

804 →

LAYERS:
  FROM:    ●1  ○2  ○3  ○4  ○5
  TO:      ○1  ○2  ○3  ○4  ●5
FINGERS:         TBD
FINGER LENGTH:   TBD
FINGER WIDTH:    TBD
FINGER SPACING:  TBD

806 →

MATCHING CELL:        ● YES    ○ NO
PARTNER CELL NAME:
TARGET CAPACITANCE:   100 pF
EVALUATED CAPACITANCE:  TBD
MATCHING TOLERANCE:   5%

| 810 | 820 |
|---|---|
| 100pF  FRINGE CAPACITOR CELL | 100pF  FRINGE CAPACITOR CELL |
| LIBRARY:   STANDARD_CELL | LIBRARY:   STANDARD_CELL |
| CELL NAME:  100pF_FCap-1 | CELL NAME:  100pF_FCap-2 |
| LOCATION:  X: 75   Y: 235 | LOCATION:  X: 327   Y: 150 |
| LAYERS:  1 AND 5 | LAYERS:  1 AND 5 |
| FINGERS:  4 | FINGERS:  4 |
| FINGER LENGTH:  50 | FINGER LENGTH:  50 |
| FINGER WIDTH:  0.12 | FINGER WIDTH:  0.12 |
| FINGER SPACING:  0.12 | FINGER SPACING:  0.12 |
| MATCHING CELL | MATCHING CELL |
| PARTNER CELL NAME:  100pF_FCap-2 | PARTNER CELL NAME:  100pF_FCap-1 |
| TARGET CAPACITANCE:  100 pF | TARGET CAPACITANCE:  100 pF |
| EVALUATED CAPACITANCE:  96 pF | EVALUATED CAPACITANCE:  104 pF |
| MATCHING TOLERANCE:  5% | MATCHING TOLERANCE:  5% |
| MATCH STATUS:  MISMATCHED − 7.7% | MATCH STATUS:  MISMATCHED + 8.3% |

| 100pF FRINGE CAPACITOR CELL | |
|---|---|
| LIBRARY: | STANDARD_CELL |
| CELL NAME: | 100pF_FCap-1 |
| LOCATION: | X: 75    Y: 235 |
| LAYERS: | 1 AND 5 |
| FINGERS: | 4 |
| FINGER LENGTH: | 50 |
| FINGER WIDTH: | 0.18 |
| FINGER SPACING: | 0.06 |
| MATCHING CELL | |
| PARTNER CELL NAME: | 100pF_FCap-2 |
| TARGET CAPACITANCE: | 100 pF |
| EVALUATED CAPACITANCE: | 98 pF |
| MATCHING TOLERANCE: | 5% |
| MATCH STATUS: | MISMATCHED - 5.8% |

822

| 100pF FRINGE CAPACITOR CELL | |
|---|---|
| LIBRARY: | STANDARD_CELL |
| CELL NAME: | 100pF_FCap-2 |
| LOCATION: | X: 327    Y: 150 |
| LAYERS: | 1 AND 5 |
| FINGERS: | 4 |
| FINGER LENGTH: | 50 |
| FINGER WIDTH: | 0.12 |
| FINGER SPACING: | 0.12 |
| MATCHING CELL | |
| PARTNER CELL NAME: | 100pF_FCap-1 |
| TARGET CAPACITANCE: | 100 pF |
| EVALUATED CAPACITANCE: | 101 pF |
| MATCHING TOLERANCE: | 5% |
| MATCH STATUS: | MISMATCHED + 6.1% |

FIG. 17

| 814 | 824 |
|---|---|
| 100pF    FRINGE CAPACITOR CELL | 100pF    FRINGE CAPACITOR CELL |
| LIBRARY:    STANDARD_CELL | LIBRARY:    STANDARD_CELL |
| CELL NAME:    100pF_FCap-1 | CELL NAME:    100pF_FCap-2 |
| LOCATION:    X: 75    Y: 235 | LOCATION:    X: 327    Y: 150 |
| LAYERS:    1 AND 5 | LAYERS:    1 AND 5 |
| FINGERS:    4 | FINGERS:    4 |
| FINGER LENGTH:    50 | FINGER LENGTH:    50 |
| FINGER WIDTH:    0.18 | FINGER WIDTH:    0.06 |
| FINGER SPACING:    0.06 | FINGER SPACING:    0.18 |
| MATCHING CELL | MATCHING CELL |
| PARTNER CELL NAME:    100pF_FCap-2 | PARTNER CELL NAME:    100pF_FCap-1 |
| TARGET CAPACITANCE:    100 pF | TARGET CAPACITANCE:    100 pF |
| EVALUATED CAPACITANCE:    98 pF | EVALUATED CAPACITANCE:    101 pF |
| MATCHING TOLERANCE:    5% | MATCHING TOLERANCE:    5% |
| MATCH STATUS:    MATCHED - 3% | MATCH STATUS:    MATCHED - 3% |

FIG. 19

```
       1010                                      1020
┌──────────────────────────────────┐  ┌──────────────────────────────────┐
│ 100pF    FRINGE CAPACITOR CELL   │  │ 100pF    FRINGE CAPACITOR CELL   │
│                                  │  │                                  │
│ LIBRARY:     STANDARD_CELL       │  │ LIBRARY:     STANDARD_CELL       │
│                                  │  │                                  │
│ CELL NAME:   FCap-1              │  │ CELL NAME:   FCap-2              │
│                                  │  │                                  │
│ LOCATION:    X: 75    Y: 235     │  │ LOCATION:    X: 327   Y: 150     │
│                                  │  │                                  │
│ LAYERS:         1 AND 5          │  │ LAYERS:         1 AND 5          │
│ FINGERS:        4                │  │ FINGERS:        4                │
│ FINGER LENGTH:  50               │  │ FINGER LENGTH:  50               │
│ FINGER WIDTH:   0.18             │  │ FINGER WIDTH:   0.06             │
│ FINGER SPACING: 0.06             │  │ FINGER SPACING: 0.118            │
│                                  │  │                                  │
│ MATCHING CELL                    │  │ MATCHING CELL                    │
│ PARTNER CELL NAME:    [FCap-2]   │  │ PARTNER CELL NAME:    [FCap-1]   │
│ TARGET CAPACITANCE:   [104 pF]   │  │ TARGET CAPACITANCE:   [96 pF]    │
│ EVALUATED CAPACITANCE: 99 pF     │  │ EVALUATED CAPACITANCE: 100 pF    │
│ MATCHING TOLERANCE:    5%        │  │ MATCHING TOLERANCE:    5%        │
│ MATCH STATUS:          MATCHED - 1% │ MATCH STATUS:          MATCHED + 1% │
└──────────────────────────────────┘  └──────────────────────────────────┘
```

FIG. 22

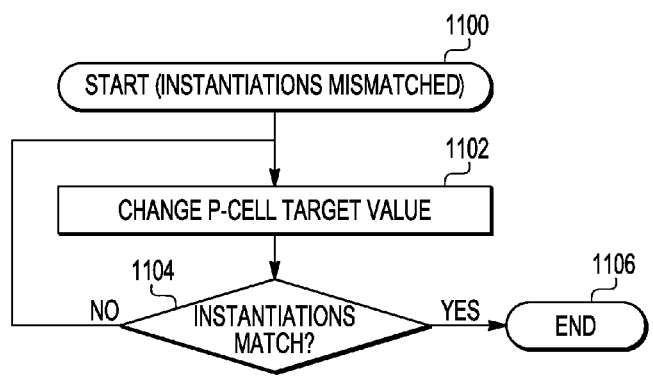

FIG. 23

DEVICE MATCHING TOOL AND METHODS THEREOF

CROSS-REFERENCE TO RELATED APPLICATION(S)

The present application is related to co-pending U.S. patent application Ser. No. 13/466,642, entitled "MISMATCH VERIFICATION DEVICE AND METHODS THEREOF," filed on May 8, 2012, the entirety of which is herein incorporated by reference.

FIELD OF THE DISCLOSURE

The present disclosure relates generally to integrated circuits, and more particularly, to design tools for integrated circuits.

BACKGROUND

Because of their complexity, integrated circuits, such as systems on a chip (SOCs), are typically designed using automated design tools, such as a computer-aided design (CAD) system. The CAD system can include automated processes to implement, verify, and improve performance, reliability, and manufacturability of the device design. For example, to verify reliability of the device design, the CAD system simulates the behavior of the device based on input stimuli and determines whether physical attributes of the device conform to design rule specifications.

In certain instances it can be desirable for devices of a same type to exhibit electrical performance characteristics that are closely matched. Traditionally, this has been accomplished by ensuring that the placement and routing of such devices themselves are the same, thus improving the electrical performance similarity of the signal processing performed by each of the matched devices. For example, sense amplifiers, differential pairs, operational amplifiers, current mirrors, and other circuits can be designed to have similar electrical performance characteristics to other devices of the same type by matching their placement and routing to each other. However, even when the mask layer shapes that make up the devices are the same and the matched devices are both compliant with a common set of design rules, the devices may operate sufficiently differently from each other to cause unacceptable mismatches in the electrical performance of the devices for an intended application. Accordingly, there is a need for techniques to improve the matching of circuits or devices that are expected to perform similarly to each other.

BRIEF DESCRIPTION OF THE DRAWINGS

The present disclosure may be better understood, and its numerous features and advantages made apparent to those skilled in the art, by referencing the accompanying drawings.

FIG. 14 is a view of a generalized parameterized-cell (p-cell) in accordance with a specific embodiment of the present disclosure;

FIG. 15 is a view of a pair of p-cell instantiations in accordance with a specific embodiment of the present disclosure;

FIG. 17 is a view of an adjustment to the pair of p-cell instantiations of FIG. 15;

FIG. 19 is a view of an adjustment to the pair of p-cell instantiations of FIG. 17;

FIG. 22 is a view of a pair of p-cell instantiations in accordance with a specific embodiment of the present disclosure;

FIG. 23 is a flow diagram illustrating another method for matching electrical performance characteristics of elements of a fabricated integrated circuit in accordance with a specific embodiment of the present disclosure;

DETAILED DESCRIPTION

Figure 1:
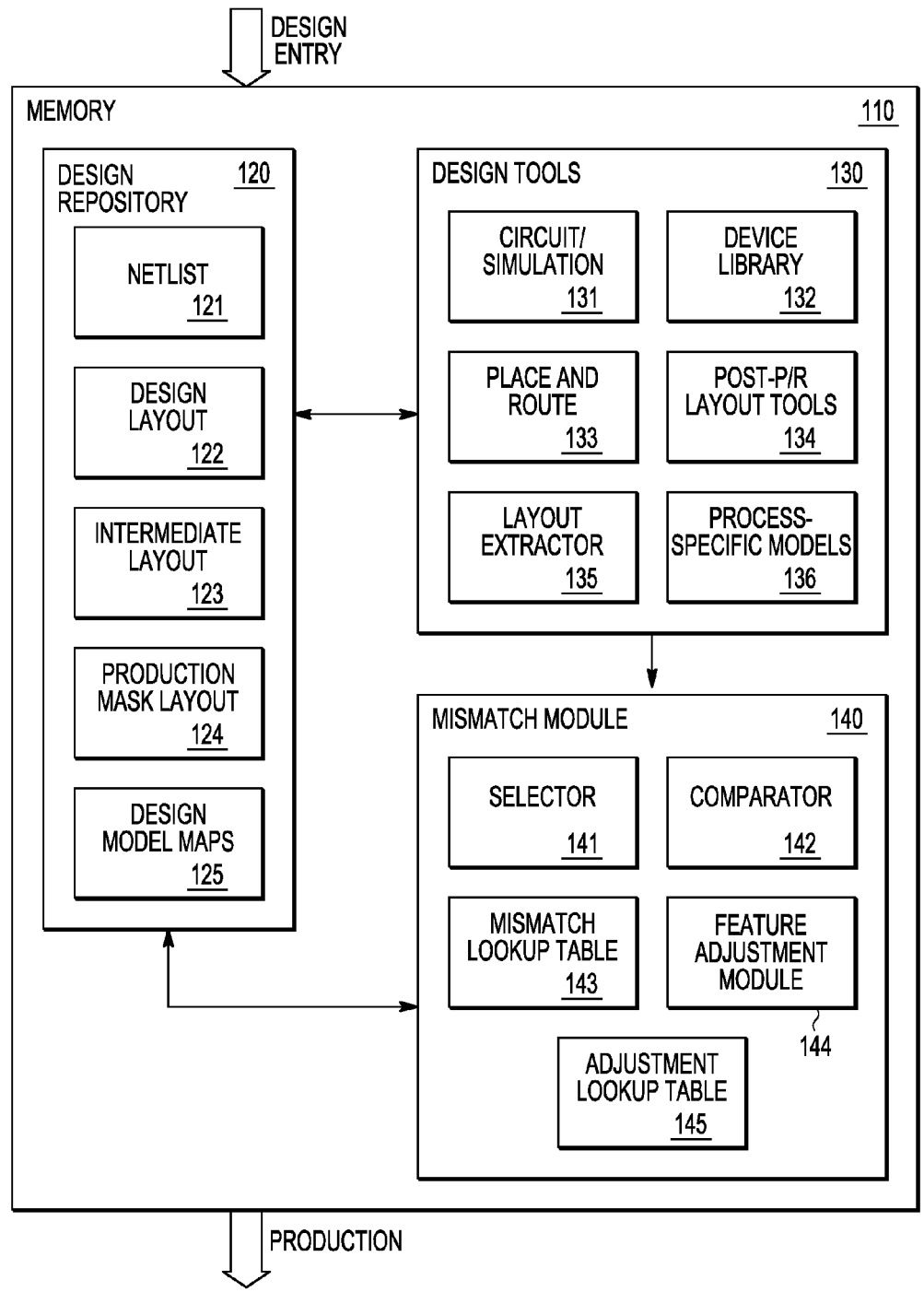
FIG. 1 is a block diagram illustrating an integrated circuit design system including computer-aided design (CAD) application modules in accordance with a specific embodiment of the present disclosure.

FIGS. 1-25 illustrate an integrated circuit design process and techniques for verifying the functionality, reliability, and manufacturability of an integrated circuit design. One or more representations of the integrated circuit design can be maintained in an integrated circuit design system. For example, a netlist can include a schematic-level representation of the devices that make up the integrated circuit design (the device design) such as logic gates, comparators, analog circuits, and the like, and the components that make up the device design (the component design) such as transistors, capacitors, resistors, and other devices, each of which can themselves be considered devices. A layout can include a representation of the physical representation of the various mask layers of an integrated circuit design, such as polygonal information corresponding to layout features of the devices and their specific dimensions, such as transistor active areas, transistor gate areas, metal interconnects, and the like. Other representations of an integrated circuit design can be maintained to support simulation and analysis of the operation of a device that is to be fabricated based upon the integrated circuit design (the fabricated integrated circuit). For example, an integrated circuit design can include representations associated with logical verification, timing verification, electrical verification, and the like.

In accordance with a specific embodiment of the present disclosure, devices of an integrated circuit design are identified that are desired to have an electrical performance characteristic that is matched to a greater degree than would otherwise be guaranteed by set of design rules associated with the device design. Devices that are identified to have a matched electrical characteristic are typically instantiations of a common device type that can have an identical layout; also, these device are intermittently referred to herein as "match devices" or "match instantiations" for additional clarity, though in other instances they are merely referred to as "devices" or "instantiations" when contextually clear.

Match devices are evaluated to determine if their respective electrical performance is sufficiently matched for their intended purposes, and can have various aspects of their respective layouts changed relative to each other in order to improve the match in their electrical performance. According to an embodiment, whether two match devices are sufficiently matched can be determined by comparing an environmental condition proximate to the first instantiation to the same environmental condition proximate to a second instantiation. As used herein, the term "environmental condition" is intended to mean a structural feature or a non-structural feature associated with the device design. Examples of structural features that are considered an environmental condition can include particular layout features, such as an active region, a transistor gate, an intra-level conductive interconnect, an inter-level conductive interconnect, an isolation region, the like. Non-structural environmental conditions can typically be represented in a contour map of an area corresponding to a device design.

For example, two match devices meeting a common set of design rules, or even having identical layouts, can be evaluated to determine if their electrical performances are matched to a desired amount that is greater than that which is guaranteed by following a particular design rule. In particular, a selector module of an integrated circuit design system identifies regions of interest for each of the match devices based upon one or more respective layout features of the match devices. A comparator module of the integrated circuit design system then evaluates one or more environmental conditions within the identified regions of interest associated with the first and second instantiations to determine if the environmental conditions within each region of interest meet a desired level of similarity. If not, the dissimilarity indicates a likelihood of mismatched electrical performance.

The regions of interest (ROIs) identified by the selector module can be determined based on layout features of one or more mask layers of the devices being matched. An active area of a device being matched can be used to define a ROI proximate to the match device, where the ROI can be larger, smaller, or the same as the active area dimension. It will be appreciated that the electrical performance of the match instantiation can be affected by virtue of stresses that the adjacent active areas induce in the active area of the match instantiation, and more specifically, by virtue of the stresses that they induce in the channel region of the instantiation. Thus, the active areas of the device design, including those active areas that are not layout features of the match instantiations, represent an environmental condition of the device design that can affect the electrical performance of the instantiations by virtue of the induced stresses in the active areas of the match instantiations.

It will be appreciated, therefore, that variations in the shapes and locations of environmental conditions, such as active areas, proximate to devices being matched can cause an electrical performance mismatch between these instantiations. The sizes of the ROIs identified by the selector module can be determined based on known process effects between particular features. For example, a particular process, which will be used to manufacture the integrated circuit having the devices being matched, will have known stress characteristics associated with its active areas that will be used by engineers to determine the ROI surrounding active areas of the devices being matched.

It will be appreciated, therefore, that the ROIs can also be larger or smaller than the geometries of the layout feature of the device used to determine a particular ROI, depending upon the particular characteristic effect being analyzed. For example, the ROI that surrounds an active area of a device being matched can be much larger than the geometry of the active area, in order to evaluate adjacent active areas. In an alternate example that determines whether or not there are significant differences in cross-coupling effects between a transistor gate and overlaying metal layer, e.g., another example of an environmental condition, the ROI of a device can be coincident with the transistor gate layout, to identify only a metal layer feature directly overlaying the gate.

Thus, while the selector module determines ROIs, the comparator module determines whether differences between environmental conditions within the ROIs are acceptable differences for a particular electrical characteristic being matched. For example, the amount of variation between environmental conditions can be used to determine whether the electrical mismatch introduced by the environmental condition is significant, i.e., whether one or more of the instantiations being matched needs modification.

In accordance with another specific embodiment of the present disclosure, a generalized parameterized cell (p-cell) represents a particular type of device of the integrated circuit design within one or more of the databases of a design repository, and can be used to define a plurality of instantiations of the device that are to have matching characteristics, as specified by the p-cell. One or more p-cell instantiations that are based upon the generalized p-cell each represent one or more instantiations of the device in the integrated circuit design.

In a particular embodiment, a mismatch analysis is performed on the p-cell instantiations in order to determine if the electrical performance characteristics of the match devices based upon the p-cell are the same to within a desired tolerance, i.e., to determine if the electrical performance characteristics of the devices are matched. A feature adjustment module operates to change one or more of the features of the p-cell instantiations in order to improve the match of the electrical performance characteristics of the devices, i.e., to adjust the electrical performance characteristics of the devices so that they are the same to within the matching tolerance. As such, upon evaluating the sources of variation between the devices and determining that the devices are not matched to within the matching tolerance, the feature adjustment module selects one or more layout features and adjusts a dimension associated with the layout feature in order to change the electrical performance characteristic of the match device with respect to the other device. In a particular embodiment, the feature adjustment module correlates the layout adjustments to an amount of change in the electrical performance characteristics of the selected device. The feature adjustment module performs layout adjustments as needed or desired to make the instantiations of the devices match to within the desired matching tolerance.

As used herein, the terms "match," "matching," "matched," or the like, as used with respect to two or more devices, are not to be construed as meaning "identical," but are to be construed with respect to a desired tolerance, e.g., a matching tolerance. For example, two devices that ideally would have a same electrical performance characteristic may be considered matched when a difference in the actual value of a particular electrical performance characteristics is less than a particular tolerance (e.g., within 2 pF of each other for a capacitor), or when a percentage between actual values of their electrical performance is within a tolerance (e.g. within 2% of each other). Further, two devices that are designed to have electrical performance characteristics that are different from each other but that have a relative relationship may be considered matched when the desired difference meets a tolerance. For example, a fringe capacitor designed to exhibit a capacitance of 100 pF can be matched to another fringe capacitor designed to exhibit a capacitance of 50 pF when the difference in the actual capacitances is 49 pF to 51 pF, e.g. a tolerance of +/−2 pF. Moreover, two devices that are designed to have different electrical performance characteristics may be matched when a ratio of the actual value of their electrical performance characteristics meets a particular tolerance.

FIG. 1 illustrates an embodiment of an integrated circuit design system 100 including computer-aided design (CAD) application modules. Integrated circuit design system 100 is operable to facilitate the design of an integrated circuit. As such, integrated circuit design system 100 represents a system implemented on one or more computers, and includes a memory 110 of the one or more computers that store a design repository 120, design tools 130, and a mismatch module 140. Design repository 120 includes one or more device design files used for storing representations of an integrated circuit design, and can include an application programming interface (API) to permit application modules to access and manipulate the attributes of the integrated circuit design that are represented in the design files. As such, design repository 120 includes one or more of the following: a netlist 121, a design layout 122, an intermediate layout 123, production mask layout 124, and design model maps 125. Design repository 120 can further include other representations of an integrated circuit design, not shown, such as a register-transfer level (RTL) model, a behavioral model, and the like.

Figure 2:
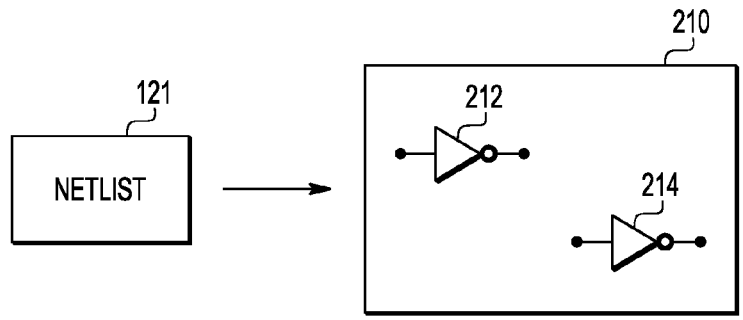
FIG. 2 is a depiction of a schematic represented by a netlist of the integrated design system shown in FIG. 1.
Figure 3:
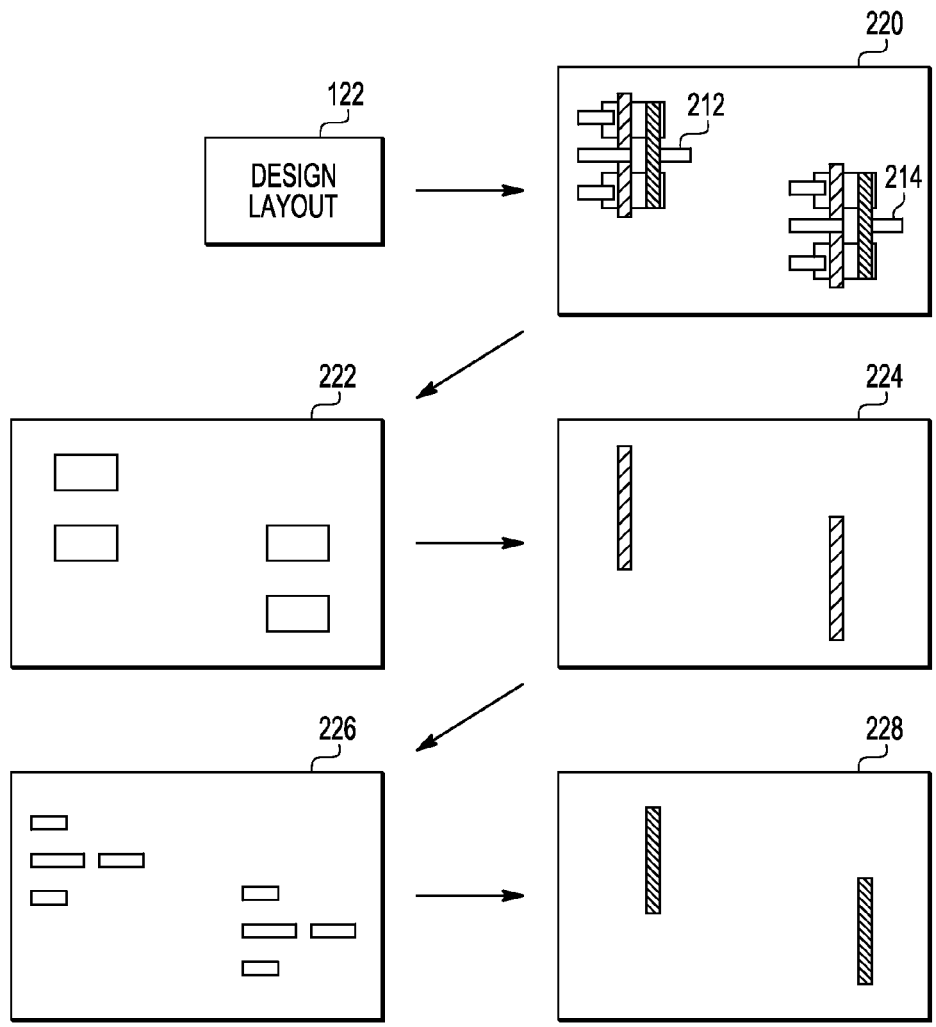
FIG. 3 is a depiction of masks represented by a design layout of the integrated design system shown in FIG. 1.
Figure 4:
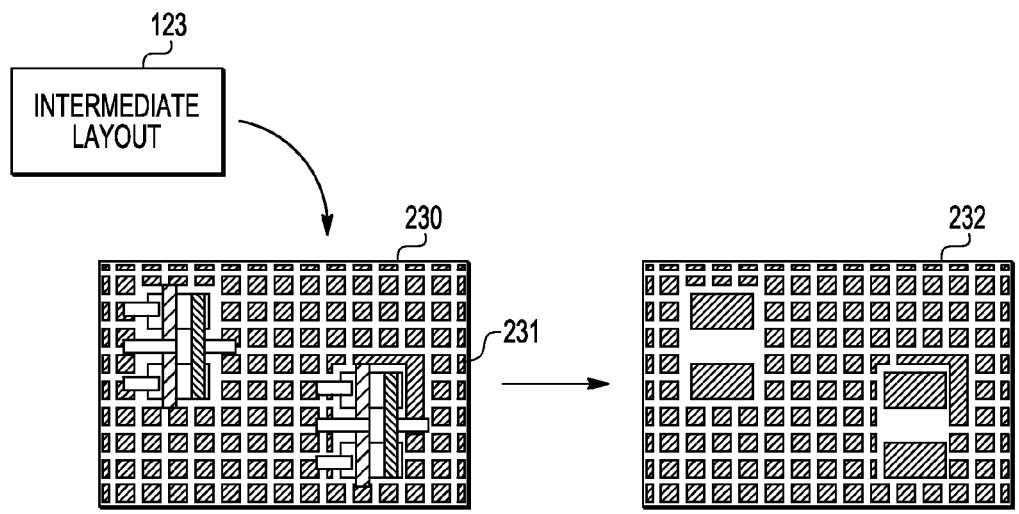
FIG. 4 is a depiction of masks represented by an intermediate layout of the integrated design system shown in FIG. 1.

Netlist 121 provides a schematic description of the integrated circuit design and can be based on circuit and signal simulations performed on the integrated circuit design. For example, FIG. 2 illustrates a schematic depiction 210 of a pair of devices 212 and 214 that are included in netlist 121. For ease of illustration, the devices 212 and 214 are presumed to be inverters. However, the concepts described herein are likely to be applied to devices of greater complexity that include additional transistors and active and passive components. For example, the concepts described herein can be used to determine electrical performance variations between digital logic devices as well as between analog devices. Design layout 122 (FIG. 1) stores a physical layout of the integrated circuit design. For example, FIG. 3 illustrates a device design layout 220 of devices 212 and 214 as represented in design layout 122. Device design layout 220 represents various mask features, e.g., layout features, from a plurality of masks, including, active area features illustrated in masking shape 222; gate dielectric/gate features illustrated in masking shape 224; first level interconnect metal features as illustrated in masking shape 226; and second level interconnect metal features as illustrated in masking shape 228. Note that contacts between the active layers and conductive layers and between various conductive layers are not shown. Intermediate layout 123 (FIG. 1) stores a modified version of design layout 122 that includes various mask features added to support manufacturability of the semiconductor device. For example, intermediate layout 123 can result from performing design-for-manufacturing (DFM) modifications such as tiling, or other post-design processing on design layout 122. FIG. 4 illustrates an intermediate layout mask 230 of devices 212 and 214 as represented in intermediate layout 123 that includes various tiling features 231, which are active areas added around the active areas of devices 212 and 214, as represented in intermediate layout 123. Masking shape 232 illustrates a representation of the active area mask after inclusion of the tiling features 231.

Figure 5:
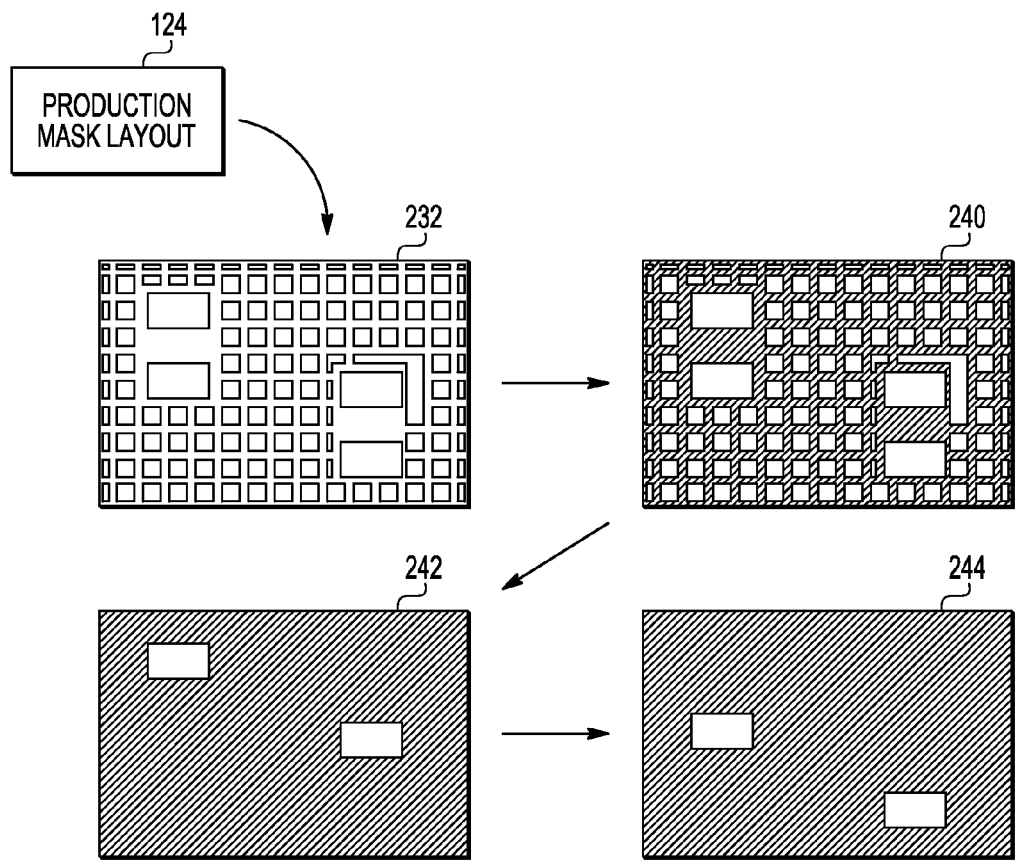
FIG. 5 is a depiction of production level masks in a production mask layout of the integrated design system shown in FIG. 1.

Production mask layout 124 (FIG. 1) stores production level mask representations of the integrated circuit design that takes into account various fabrication process steps that are necessary to the fabrication of the integrated circuit design, but that are transparent to designers of integrated circuit device designs, and associated layout tools. For example, production mask layout 124 can include optical proximity correction (OPC) features as needed for various mask layers, as well as additional production masks where the mask shapes are derived from Boolean combinations of source layout shapes, for example, implant and stressor masks. For example, FIG. 5 illustrates production level masks associated with active area masking shapes 232, as represented in production mask layout 124. The production level masks include an isolation mask 240, a p-well mask 242, and an n-well mask 244. One skilled in the art will appreciate that production mask layout 124 can include other OPC features than those illustrated, such as serifs and anti-serifs. Design model maps 125 (FIG. 1) provide variations in the simulation and modeling of the design-specific effects of the integrated circuit design on the instantiations of the devices to be matched, and include mappings of the integrated circuit design for various effects, as described further, below.

Integrated circuit design system 100 (FIG. 1) includes various application modules such as design tools 130 and mismatch module 140, which itself may be a design tool. The application modules are configured to manipulate and analyze the integrated circuit design information included in design repository 120 to derive a desired representation of the integrated circuit design. During the design process, design repository 120 changes as a design progresses. For example, based on simulations of the integrated circuit design, a design repository 120 can be altered so that the integrated circuit design complies with a specification. For example, the netlist can be altered to add or remove devices, or components of devices, in order to meet desired timing requirements. Alternatively, the design layout 122 can be modified based upon post-place-and-route simulations to address various timing issues. The changes to the integrated circuit design are reflected by corresponding changes to design repository 120 that are evaluated by further simulation and testing.

Once the design process is complete, the integrated circuit design is used to fabricate the integrated circuit. For example, production mask layout 124 can include a representation of the integrated circuit design that includes information relating to physical photomask features that can be provided to a mask fabrication facility to prepare masks to be provided to an integrated circuit fabrication facility. In one embodiment, design tools 130 and mismatch module 140 include hardware modules, software modules, or a combination thereof. Each application module is executed as described herein to perform an associated design function. Integrated circuit design system 100 can include additional application modules that are associated with other aspects of the design process. For example, integrated circuit design system 100 can include a layout verification module operable to identify and validate a correspondence between information included at netlist 121 and physical information stored at design layout 122, a timing analysis module to verify that a fabricated integrated circuit based on the integrated circuit design can operate at a desired speed, and the like.

Figure 6:
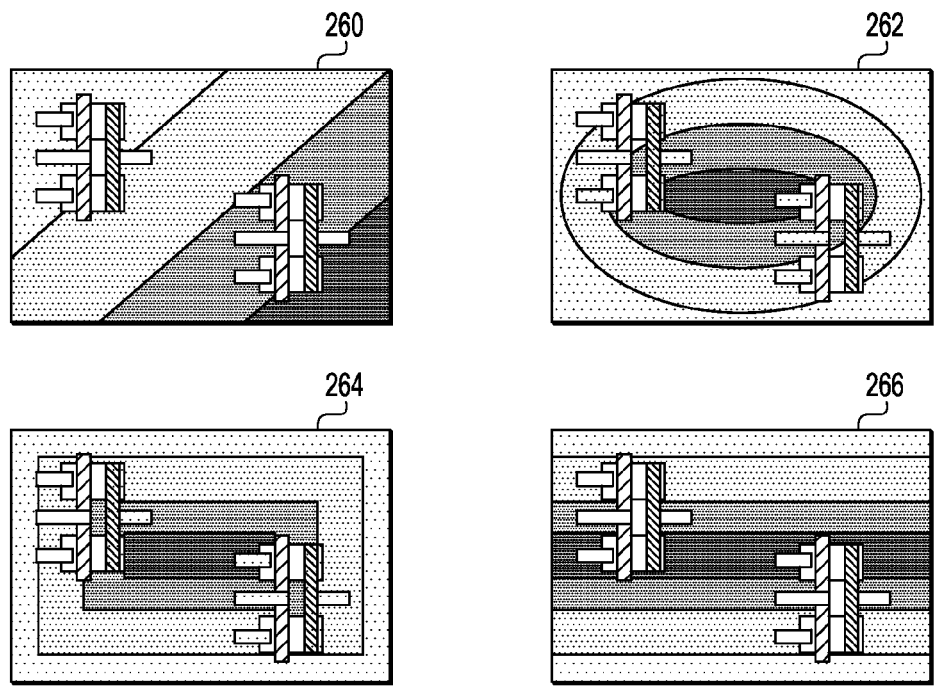
FIG. 6 is a depiction of mapping of process variations from a set of processing models of the integrated design system shown in FIG. 1.

Design tools 130 includes one or more application modules that are accessed to analyze and manipulate the attributes of the integrated circuit design, including circuit and simulation tools 131, a device library 132, place-and-route (P/R) tools 133, post-P/R layout tools 134, a layout extractor 135, and process-specific models 136. Circuit and simulation tools 131 provide designers with an ability to simulate various aspects of the integrated circuit design, including logical performance, real-time performance, power consumption, and the like. In particular, circuit and simulation tools 131 can operate on the files of design repository 120 to model the integrated circuit design for various conditions that are known to exist in the fabricated integrated circuit for a particular process. For example, a fabricated integrated circuit can exhibit varying electrical performance characteristics based on the location of a particular device relative to other devices/features, based on aging effects for the device, based on temperature sensitivity effects and based on other effects. As such, a device may be located in an area of the fabricated integrated circuit that has a power profile, temperature profile, or other environmental condition profile, that can affect the electrical performance of the device. Further, the power environment experienced by the integrated circuit can affect the device, as can aging effects, current-resistance (I-R) drop, or current density. These and other environmental condition variables can be simulated in circuit and simulation tools 131, or can be acquired deterministically. FIG. 6 illustrates examples of mappings of some of these effects including a first process model variation map 260, a second process model variation map 262, a third process model variation map 264, and a fourth process model variation map 266, wherein darker regions of the mapped effects represent a greater magnitude. For example, one of the maps may represent a temperature gradient map, wherein the darker regions represent areas of higher temperature relative to lighter areas. Another map may represent a dielectric thickness map, wherein the darker regions represent areas of higher dielectric thickness relative to lighter areas. As used herein, the term "environmental condition" is intended to mean a structural feature or a non-structural feature associated with the device design. Examples of structural features that are considered an environmental condition include particular layout features, such as a metal layer, an isolation region, a thickness of a dielectric layer, the like, and combinations thereof. Examples of non-structural features that can be considered environmental conditions, and which can typically be represented in a contour map, include temperature, stress, the like, and combinations thereof.

Device library 132 (FIG. 1) includes various predefined devices, such as standard cells and parameterized cells (p-cells), that can be used by the designer to implement desired functions. For example, a designer can choose to access device library 132 to select a standard inverter, operational amplifier, phase-locked loop, another integrated circuit device, or a combination thereof, rather than to design each of these devices individually. P/R tools 133 operate to locate (place) devices from netlist 121 at physical locations of the integrated circuit design, and to provide interconnections (route) between the devices. Post-P/R layout tools 134 operate to provide features for tiling, DFM, physical verification, and other features. Subsequent to place and route, layout extractor 135 can be used to translate some or all of the representations of physical information stored at design repository 120 into information representing physical characteristics of a particular device. For example, layout extractor 135 can determine for each device output of a device design an associated capacitance, resistance, and the like. Similarly, layout extractor 135 can determine various characteristics associated with individual interconnects. Layout extractor 135 may include a commercially available extractor, a proprietary extractor, or a combination thereof.

Simulation tools 131 can provide capacitance and resistance information in order to provide a more accurate timing simulation of a device design based upon the actual placement of devices and interconnect characteristics. With respect to comparing electrical performance of devices that are to have matched electrical performance characteristics, extraction tools can extract information associated with each instance of the device, such as capacitance and resistance information, as well as information proximate thereto, such as active area or density information, and other routing information as desired. With respect to a particular implementation of the present disclosure, layout extractor 135 can extract layout information associated with each instantiation of a device to be matched. Should instantiations have different orientations, the layout extractor 135 can compensate for the orientation differences by rotating, in order to facilitate comparisons of features proximate to each instantiation as needed.

Process-specific models 136 provide designers with an ability to simulate devices based upon specific aspects of the integrated circuit fabrication process that will be used to manufacture final devices. In particular, process-specific models 136 can be used in conjunction with the files of design repository 120 to model the integrated circuit design for various conditions that are known to exist with respect to a particular manufacturing process. For example, a fabricated device can be expected to exhibit a particular set of electrical performance characteristics based on the gate geometries used with respect to a particular manufacturing process. In addition, it will be appreciated that the actual manufacturing process used to implement the integrated circuit can affect other electrical performance characteristics of a device. Thus, the process specific models 136 are used to simulate a target process.

Mismatch module 140 is an application module operable to determine whether the electrical performance of a first instantiation of a device of the integrated circuit design is predicted to match the electrical performance of a second instantiation of a device of the same type. Hereinafter, the description of mismatch module 140 will be with reference to instantiations of devices. Mismatch module 140 includes a selector 141, a comparator 142, a mismatch lookup table 143, a feature adjustment module 144, and an adjustment lookup table 145. In a particular embodiment, mismatch module 140 is included in design repository 120, in design tools 130, or a combination thereof. In another embodiment, mismatch module 140 is derived from information included in design repository 120, in design tools 130, or a combination thereof.

In a particular embodiment, mismatch lookup table 143 identifies specific devices of an integrated circuit design that are to be analyzed to determine whether they meet a desired matching tolerance. Table 1, below, represents a specific embodiment of a mismatch lookup table that includes information indicating a particular manner that device 510 and device 520 (illustrated in FIG. 8 as described below) are to match. In particular, Table 1 includes three match records associated with devices 510 and 520, wherein each one of the match records contains information that can be accessed by the various portions of mismatch module 140.

TABLE 1

Mismatch lookup table

| Match Devices | Match Record | Select Feature | ROI Dimension | Critical Feature | Critical Feature Tolerance |
|---|---|---|---|---|---|
| 510, 520 | 1 | Gate | 0 nm | Metal Overlay Layers | $\Delta XY < 40$ nm$^2$ |
|  | 2 | Active Area | 20 nm | Active Masks | $\Delta X < 2$ nm $\Delta Y < 4$ nm |
|  | 3 | Device | 0 nm | Temperature Map | $\Delta T_V < 3$ deg C. $\Delta T_{DR} < 0.5$ deg C. |

Selector 141 of mismatch module 140 selects ROIs for each of the device instantiations to be matched. For each instantiation, these ROIs can include a portion of the device, all of the device, regions proximate the device, and the like. In a particular embodiment, selector 141 selects the ROIs based on a design feature of the device instantiations being matched. A particular design feature used by selector 141 to determine the ROI can be a design feature that is specific to one or more mask layers of the integrated circuit design. For example, with respect to Table 1, the column labeled Select Feature identifies design features of the device instantiations that are used to identify a ROI being analyzed with respect to a particular match record. Thus, with respect to match record 1 of Table 1, the gate of matched devices 510 and 520 is used to identify a ROI as further described below.

Comparator 142 compares a specified environmental condition, referred to as a critical feature or a compare feature, within the ROIs for each of the devices to be matched to determine if electrical performance for each device is matched with the other. In a particular embodiment, the critical features within a ROI are represented by polygons, and the comparator performs a logical exclusive-OR (XOR) between the ROIs to determine the differences between the polygons of respective instantiations, and whether these differences are within a critical feature tolerance. For example, with respect to Table 1, the column labeled Critical Feature identifies design features of the device design that are compared to determine if the instantiations match. Thus, with respect to match record 1 of Table 1, the metal overlay layers of the device design are used to determine if the instantiations match as further described below. If the devices are matched (as defined by differences between the critical features being less than the critical feature tolerance of Table 1), a match is indicated and further design work on the devices may not be necessary. If the devices are not matched (as defined by differences between the critical features exceeding the critical feature tolerance), then a mismatch is indicated and further design work may be performed to modify design repository 120 to obtain a better match between the devices. For example, the feature adjustment module 144 can operate in a manner determined by adjustment lookup table 145 to modify one or more device features of one or both of instantiations 510 and 520. In an alternate embodiment, features proximate to one or more of instantiations 510 and 520 can be modified. The operation of mismatch module 140 can be utilized at any stage of the design process. As such, devices can be matched in netlist 121, design layout 122, intermediate layout 123, and production mask layout 124. Note that while features of mask layers are described herein, comparator 142 can also make comparisons based upon simulations of the integrated circuit design, where the comparisons are based upon predicted values for the features. For example, comparator 142 can compare predicted device widths, predicted dielectric thicknesses, or other predicted features, as needed or desired.

Design model maps 125 provide variations in the simulation and modeling of the design-specific effects of the integrated circuit design on the instantiations of the devices to be matched, and include mappings of the integrated circuit design for various effects as described above with respect to FIG. 6. In a particular embodiment, comparator 142 determines if variations in the values of the mappings between instantiations are within critical feature tolerances. In another embodiment, comparator 142 determines if the range of values across each instantiation, hereinafter described as delta ranges, are within a critical feature tolerance. For example, where the electrical performance matching of a pair of devices is affected by a design-specific effect, design model maps 125 can supply a permitted variation between each device of the pair of devices, or can supply a permitted delta range across each device. In another embodiment, the ROIs are provided by selector 141 and comparator 142 to determine if the variations and delta ranges are within the permitted variations and permitted delta ranges provided by design model maps 125. The permitted variation between each instantiation of the devices to be matched, or the permitted delta range across each instantiation, is supplied by mismatch lookup table 143. For example, given a mapping of the expected temperature across an integrated circuit design, the value of the temperature may be deemed to be important to the matching of the electrical performance of a pair of devices, and so a permitted variation between the expected temperatures for each device can be specified. If the difference in the expected temperature between the devices is greater than the permitted variation, the expected match between the devices may be poor. In other words, the permitted variation is a way to measure whether each device is on a same or similar contour of the associated design model map 125. Further, the delta range of temperatures experienced by each device of a pair of devices to be matched may be deemed to be important to the matching of the devices, and so a permitted delta range of the expected temperatures for each device can be specified. If the temperature difference across each device is greater than the permitted delta range, the expected match between the devices may be poor. In other words, the permitted delta range is a way to measure whether each device is in an area with a same or similar gradient of the contours of the associated design model map 125.

As discussed previously, Table 1 provides an example of mismatch lookup table 143, wherein each match record identifies the following: the device instantiations to be matched, a match record number, a select feature, a ROI dimension, a critical feature, and a critical feature tolerance. Here, for example, the device instantiations to be matched include devices 510 and 520 of FIG. 8 (described below). In the example of Table 1, there are three match records, as described below with respect to FIGS. 10-13. The selected feature of each match record identifies a physical feature of the given device instantiations to be matched, and usually is a feature that is defined by one or more mask layers or a value at a location or set of locations as defined by a design model map. In the example of Table 1, the select feature of match record 1 used to determine a ROI is the gate area of the instantiations, the select feature of match record 2 used to determine a ROI is the active area of the instantiations, and the select feature of match record 3 used to determine a ROI includes all of the devices of the instantiations. Other examples of selected features include: n-type active areas; p-type active areas; interconnects; certain levels of interconnects; channel regions; and other features as needed or desired. Typically, the select feature is associated with portions of the particular device type that affect electrical performance variations between instantiations.

The ROI dimension is a dimension stored at the match record that is used to identify a region proximate the indicated select feature of the match record, wherein the ROI is used to indicate the region associated with a particular match record that is to be analyzed by mismatch module 140. In the example of Table 1, the ROI dimension of match record 1 to be applied to the gate area of match record 1 is 0 nanometers (nm) thus, only the gate area of each instantiation is selected as the ROI of record 1. The ROI dimension applied to the active area of match record 2 is 20 nm; thus, the active area of each instantiation and anything within 20 nm of each instantiation is selected as the ROI of record 2. The ROI dimension applied to the device area of match record 3 is 0 nm. Thus, the gate area of the entire instantiation is selected as the ROI record 3. The ROI dimension for the select features can also be a negative value, indicating that the ROI includes only a portion of the select feature. Typically, the select feature is associated with portions of the particular device type that affect electrical performance variations between instantiations. It may be noted that the ROI may also have different dimensions in the x and y directions relative to the device or feature of interest and that for a given layer, there may be more than one ROI, for example, for different process steps such as etch and CMP.

Each match record also includes a critical feature (environmental condition) that indicates a characteristic/feature to be analyzed within the ROI dimension, and which can be the same or different than the selected feature. In the example of Table 1, the critical feature associated with the ROI of match record 1, e.g., the gate area of each instantiation, includes the metal mask layers that overlay the gate mask, the critical feature associated with the ROI of match record 2, e.g., anything within 20 nm of a active area, includes the active mask layers that make up the active area of the integrated circuit design, and the critical feature for the device associated with the ROI of match record 3 includes a temperature map, such as a temperature map from design model maps 125. Typically, the critical feature of the device design is a feature that causes an electrical performance variation to occur at the portion of the device type identified by the selected feature.

The critical feature tolerance quantifies how much critical feature variation between instantiations is an acceptable amount in order to deem the pair of devices as "matched" or "mismatched." In the example of Table 1, the critical feature tolerance for match record 1 is provided as an area of $\Delta XY < 40$ nm². Here, an area of mismatch for the gate layer and the overlaying metal layers between the instantiations is determined, and if the difference in the area of the mismatch between the instantiation is less than the critical feature tolerance, then the instantiations are "matched", but if the difference in the area is greater than the critical feature tolerance, then the instantiations are "mismatched" as described further in FIG. 10 below. Also, the critical feature tolerance for match record 2 can be described by separate tolerances for the X- and the Y-dimensions as $\Delta X < 2$ nm and $\Delta Y < 4$ nm. Here, linear dimensions of mismatch for the active area masks between the instantiations are determined, and if the differences in the feature dimensions in each direction is less than the critical feature tolerance, then the instantiations are "matched", but if any length of the mismatch for the active area masks is greater than the critical feature tolerance, then the instantiations are "mismatched" as described further in FIGS. 11 and 12, below.

Further, the critical feature tolerance for match record 3 is described by variation consistent with a map of a temperature variation ($T_V$) of $\Delta T_V < 3$ deg C., and by a delta range ($T_{DR}$) of $\Delta T_{DR} < 0.5$ deg C. Note that, in a particular embodiment, a mapping of a design process can be described by dividing the integrated circuit design into cells (i.e., squares), and ascribing a value of the design process within each cell. As such, a particular select feature can encompass more than one cell, and thus be describable by more than one value. Here, for example, where a device encompasses four cells, a separate comparison can be performed between each corresponding cell of the different instantiations, or alternatively, a single combined metric, such as an average value or a range, can be utilized.

The matching of devices contrasts with a design rule in that the design rule can ensure that a particular feature on each device meets common criteria and therefore that the devices meet a particular electrical performance level within a defined range, while matching ensures that the electrical performance of each device is similar based upon the surroundings of the devices. As such, the designs of a pair of devices that are to be matched can each meet a particular set of design rules and furthermore have closely or identically matched layout, yet they may fail to have similar enough electrical performance for a particular application because of the presence of surrounding devices, components, or features, or process model effects on the pair of devices.

Figure 7:
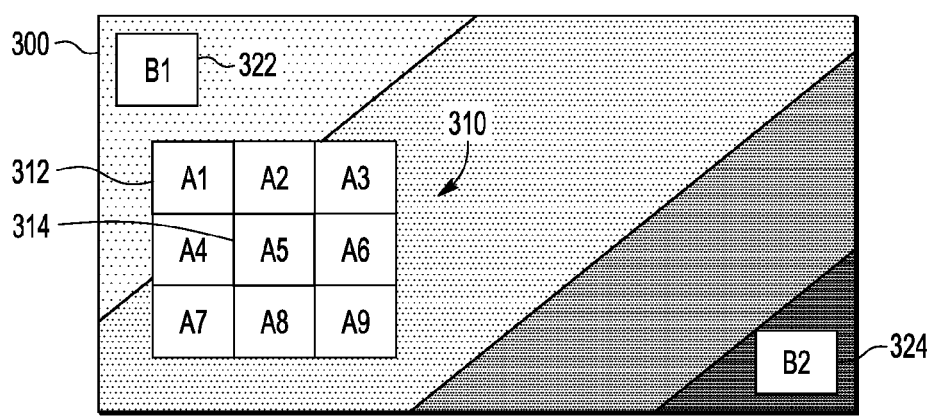
FIG. 7 is an overview of a fabricated integrated circuit in accordance with a specific embodiment of the present disclosure.

FIG. 7 illustrates an embodiment of a fabricated integrated circuit 300, including an array of devices 310, and devices B1 (322) and B2 (324). Array 310 illustrates a portion of fabricated integrated circuit 300 where several similar elements, labeled A1 through A9, are to be matched. For example, array 310 can include static random access memory (SRAM) cells, parallel analog signal paths, or other devices which are similar and are in close proximity to each other on fabricated integrated circuit 300. Here, even though the devices are arranged close to each other, the circuit environment for each device A1-A9 may be different from the others. To illustrate, element A1 (312) is on a corner of array 310, and is surrounded by the elements labeled A2 and A4. Element A5 (314) is in the middle of array 310, and is surrounded by the elements labeled A2, A4, A6, and A8. Thus the electrical performance of element A1 can be matched with element A5 based on an extracted version of the relevant process database, in order to more accurately account for the different environments of elements A1 and A5. For example, the extracted database can account for parasitic capacitances and resistances that are unique to each element, for cross-talk between elements A1 and A5, and for other effects from neighboring elements to array 310.

Elements 322 and 324, labeled B1 and B2, respectively, represent elements that are of the same type, and that are to be matched, but that are on different portions of fabricated integrated circuit 300. For example, elements B1 and B2 can include fringe capacitors, transistors, operational amplifiers, or other elements which are of the same type and are intended to exhibit the same electrical performance, but are on different portions of fabricated integrated circuit 300. Here, because elements B1 and B2 are arranged on different portions of fabricated integrated circuit 300, the local process variation environment for element B1 may be different from the process variation environment for element B2. For example, elements B1 and B2 may be in portions of fabricated integrated circuit 300 that are experiencing different lattice stresses, different power, thermal, or current gradients, different topographical densities, that are subject to different aging effects, or otherwise be in regions that experience different process conditions. As such, the electrical performance of element B1 can be compared with the electrical performance of element B2 based on a mapping of various process models on fabricated integrated circuit 300.

Figure 8:
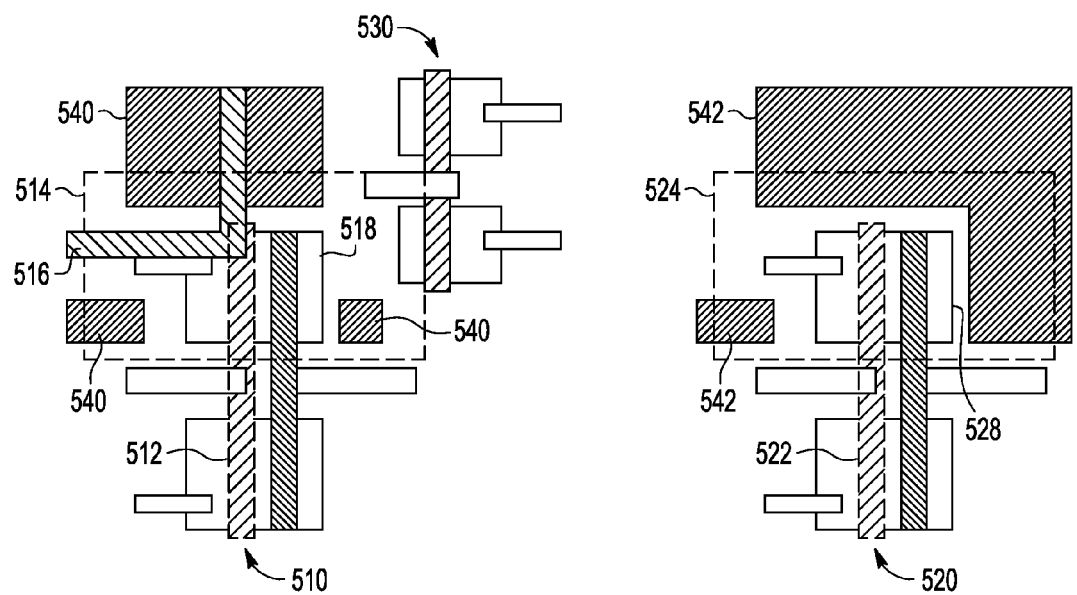
FIG. 8 is a layout view of a pair of devices of the integrated circuit shown in FIG. 7 in accordance with a specific embodiment of the present disclosure.

FIG. 8 illustrates an embodiment of a pair 500 of devices 510 and 520 of the integrated circuit shown in FIG. 7 that are to be matched. Devices 510 and 520 are depicted with various layout features of the device design that are proximate to devices 510 and 520. As such, device 510 is in proximity to a CMOS switch 530, and to other active areas 540; while device 520 is in proximity to other active areas 542. Note that active areas 540 and 542 can represent adjacent active or passive devices or tiling features that are representative of an environmental condition of the device design. Device 510 is also overrun by an interconnect metal layer 516 representative of another environmental condition. Note that distances between devices 510 and 520 are not depicted to scale, and that devices 510 and 520 can represent elements of fabricated integrated circuit 300 that are close to each other, such as elements 312 and 314, or can represent elements of fabricated integrated circuit 300 that are on different portions of fabricated integrated circuit 300, such as elements 322 and 324. A selector similar to selector 141 operates to select ROIs 512 and 514 for element 510, and respective matching ROIs 522 and 524 for element 520 based upon a match record.

Figure 9:
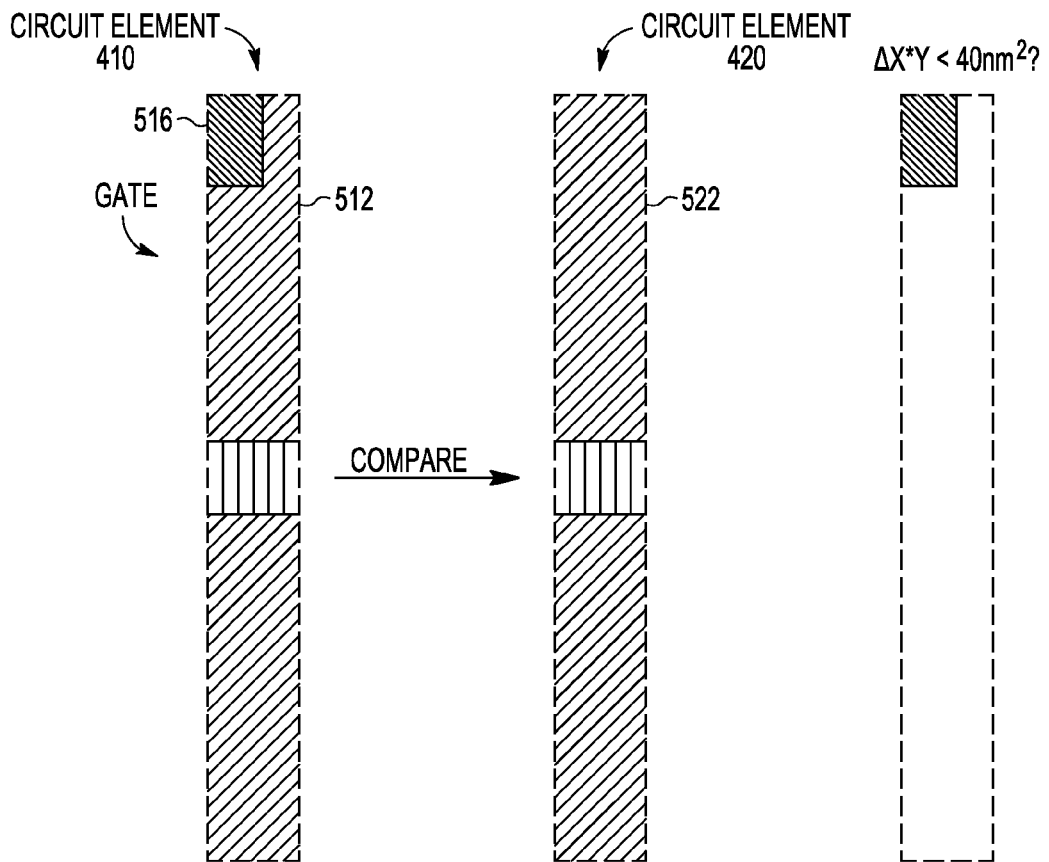
FIG. 9 is a magnified layout view of regions of interest (ROIs) shown in FIG. 8 in accordance with a specific embodiment of the present disclosure.

ROIs 512 and 522 relate to features of devices 510 and 520 formed by the gates of respective devices 510 and 520. For example, an undesirable capacitive coupling in the gates of devices 510 and 520 can depend upon an amount of interconnect metal overrunning the respective gates being greater than or equal to 40 nm$^2$. Match record 1 of Table 1 illustrates this example, where, as illustrated in FIG. 9, the capacitive coupling to the gate of device 510 can be matched to the capacitive coupling of the gate of device 520, and to confirm that the area of overrunning metal is different between the instantiations by less than 40 nm$^2$. Note that a particular ROI can be compared based upon different circuit layers, or upon different masks that make up the layers. When the comparison fails, then the designer of the integrated circuit can iterate the design of the associated layer or mask to ensure that circuit devices 510 and 520 are matched within the desired tolerances.

Figure 10:
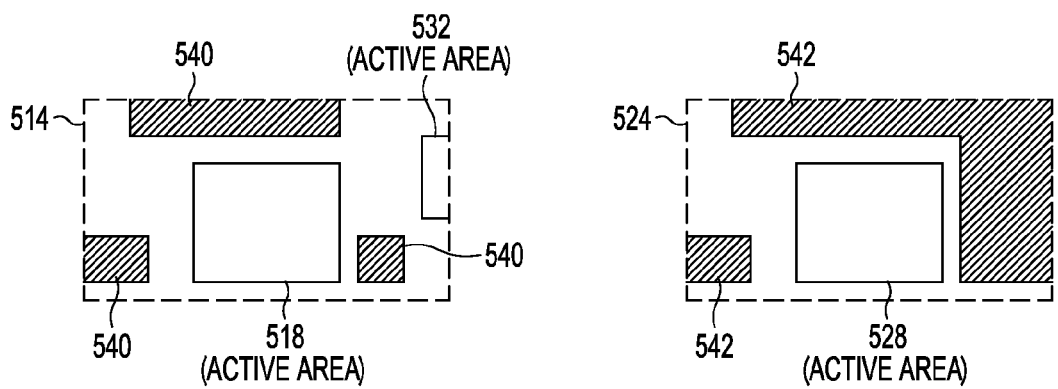
FIG. 10 is a layout view of the ROIs shown in FIG. 8 in accordance with a specific embodiment of the present disclosure.

ROIs 514 and 524 (FIG. 8) relate to active area features surrounding the active areas of devices 510 and 520. For example, matching of the electrical performance of devices 510 and 520 can be dependent upon the proximity of tiling areas and active areas of other devices to the active areas of devices 510 and 520. Match record 2 of Table 1 illustrates this example, where, as illustrated in FIG. 10, ROI 514 includes an active area 518 of circuit device 510, an active area 532 of switch 530, and active area 540, and ROI 524 includes an active area 528 of circuit device 520 and active area 542.

Figure 11:
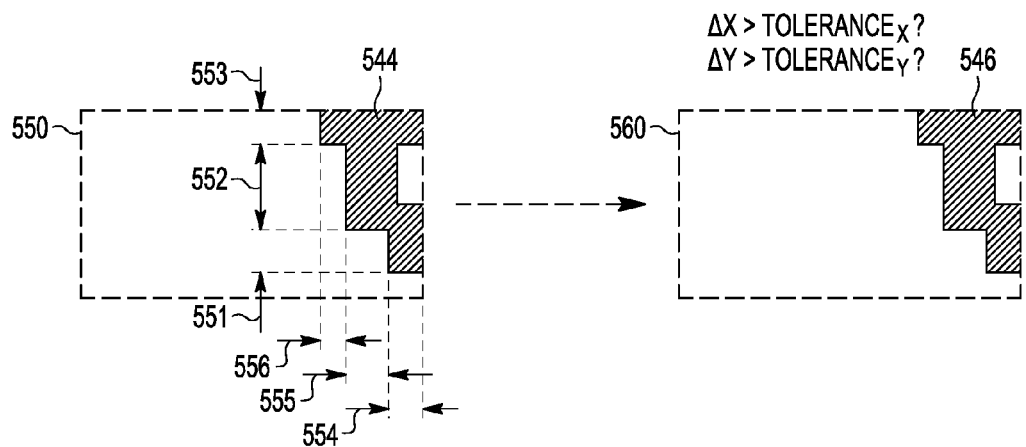
FIG. 11 is a layout view of the differences between the ROIs shown in FIG. 10 in accordance with a specific embodiment of the present disclosure.

FIG. 11 illustrates a comparison 550 of ROIs 514 and 524, made with respect to active areas 518, 528, and 532, and active areas 540 and 542. In a particular embodiment, comparison 550 is generated by performing a logical XOR between ROIs 514 and 524, such that a difference area 544 is defined as the area where active areas 518 and 532 and active areas 540 are different from active area 528 and active areas 542. Difference area 544 can be measured to determine dimensions 551-556, as illustrated. Dimensions 551-553 are determined with respect to a first axis of fabricated integrated circuit 300, here illustrated by vertical dimensions, and dimensions 554-556 are determined with respect to a second axis of fabricated integrated circuit 300, here illustrated by horizontal dimensions. The match record defines tolerance values for dimensions 551-556, such that, if a portion of difference area 544 has a dimension that is less than the tolerance value, the electrical performance of devices 510 and 520 will be within the allowed tolerance with respect to each other, and if the portion of difference area 544 has a dimension that is greater than the tolerance value, the electrical performance of devices 510 and 520 will be different from each other.

Thus, for example, tiling features on fabricated integrated circuit 300 can create different stresses on the substrate that can affect the electrical performance of circuit devices 510 and 520. Therefore, it can be desirable to modify the layout of the elements that are proximate to circuit devices 510 and 520 to better match their electrical performance. Further, the effects from the tiling features on circuit devices 510 and 520 can be greater in one axis than in the other. As such, the tolerance value for the first dimension is not necessarily the same as the tolerance value for the second dimension. For example, dimensions 551, 552, and 553 can be 25 nm, 45 nm, and 15 nm, respectively, with a tolerance of 20 nm for the first axis. Further, dimensions 554, 555, and 556 can be 20 nm, 20 nm, and 10 nm, respectively, with a tolerance of 15 nm for the second axis. A modified comparison 560 is generated by performing a logical XOR between ROIs 514 and 524, taking into account the tolerances for each axis, such that a difference active area 546 is defined as the area where active areas 540 are different from active areas 542 by greater than the tolerances for each axis. Here, for example, because dimension 553 is smaller than the tolerance value for the first axis, and dimension 556 is smaller than the tolerance value for the second axis, the portion of difference area 544 that is defined by dimensions 553 and 556 is excluded from modified comparison 560, and a design iteration can be performed on the active layer to eliminate difference shape 546 so that the electrical performance of circuit devices 510 and 520 can be more closely matched. In another embodiment, areas of the difference shapes can be used in conjunction with, or in contrast to, the dimensions in each axis. Moreover, while it is an option for critical features to result in comparison of individual shapes, it may also be necessary to compare many or all features of a mask including active areas and tiles as one entity.

Figure 12:
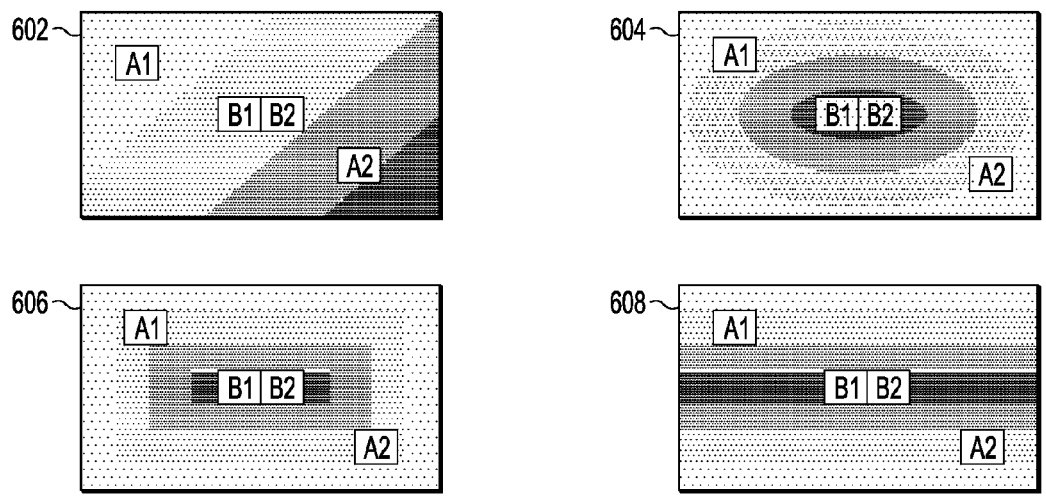
FIG. 12 is an overview of a fabricated integrated circuit illustrating maps of process models in accordance with a specific embodiment of the present disclosure.

FIG. 12 illustrates exemplary embodiments of maps of process variations on a fabricated integrated circuit 600. Four different process variation maps for integrated circuit 600 are illustrated in FIG. 12, including, a first mapped process variation 602, a second mapped process variation 604, a third mapped process variation 606, and a fourth mapped process variation 608. For example, mapped process variations 602, 604, 606, and 608 can represent one or more of a stress gradient, a thermal gradient, a feature density map, a checkbox value, a current gradient, an IR drop, a power distribution, a power profile, a parasitic resistance/capacitance (RC)

extraction, a lithography imaging profile, an oxide thickness profile, a planarity profile, or another process variation. The shading of mapped process variations 602, 604, 606, and 608 is illustrative of a particular value range for the associated process variation. As such, a lighter coloration can represent a higher value for the associated process variation than a darker coloration, or can represent a lower value, as needed or desired.

Fabricated integrated circuit 600 includes a first pair of devices, labeled "A1" and "A2," that are desired to have their electrical performance matched to each other, and a second pair of devices, labeled "B1" and "B2," that are desired to have their electrical performance matched to each other. Mapped process variation 602 indicates that device A1 is in an area of fabricated integrated circuit 600 that has a different process variation value than device A2, and that devices B1 and B2 are in an area of fabricated integrated circuit 600 that has a relatively constant process variation value. As such, devices A1 and A2 will have a more significant performance mismatch due to the first process variation than devices B1 and B2. Mapped process variation 604 indicates that devices A1 and A2 are in areas of fabricated integrated circuit 600 that has a nearly constant process variation value, and that devices B1 and B2 are in areas of fabricated integrated circuit 600 that have different variable process variation values. Thus devices A1 and A2 may not have a source of mismatch with respect to the second process variation, but devices B1 and B2 may have a source of mismatch with respect to the second process variation.

Mapped process variation 606 indicates that both of the pairs of devices A1 and A2, and B1 and B2 are in respective areas of fabricated integrated circuit 600 that have nearly constant process variation values. Thus neither of the device pairs A1 and A2 nor B1 and B2, with respect to mapped process variation 606, will be mismatched due to the third process variation. Mapped process variation 608 indicates that both of the pairs of devices A1 and A2, and B1 and B2 are in respective areas of fabricated integrated circuit 600 that have nearly constant process variation values. As such, neither pair of devices A1 and A2, and B1 and B2 may have sources of mismatch with respect to the fourth process variation. In a particular embodiment, the average value for a process variation can be calculated across a region of interest for devices to be matched, and the average value can be provided as the value to comparator 142, as described above. In another embodiment, the range of process variation values across a region of interest for devices to be matched can be provided to comparator 142. In yet another embodiment, values of process variation at each corresponding point within a region of interest may be provided to comparator 142 to be compared with the corresponding points in the device instantiations. One or more of mapped process variations 602, 604, 606, or 608 are exemplified by match record 3 of Table 1.

Figure 13:
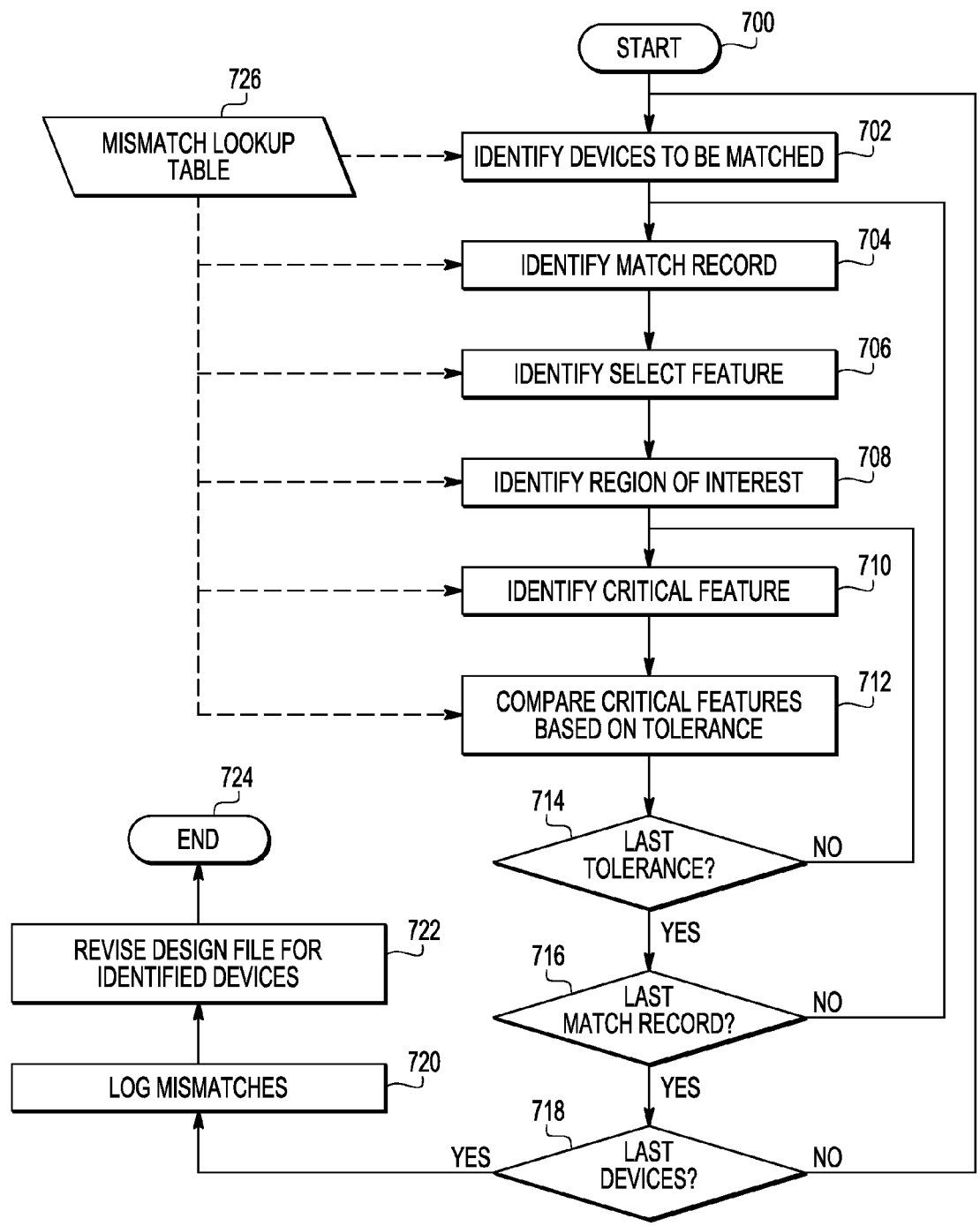
FIG. 13 is a flow diagram illustrating a method for performing a mismatch analysis of matched elements of a fabricated integrated circuit in accordance with a specific embodiment of the present disclosure.

FIG. 13 illustrates an embodiment of a method for performing a mismatch analysis of matched devices of an integrated circuit design, starting at block 700. Devices of an integrated circuit that are to be matched to each other are identified in block 702. The devices are identified based upon a mismatch lookup table 726, which can be similar to the mismatch lookup table of Table 1. For example, devices 510 and 520 (FIG. 8) of fabricated integrated circuit 300 can be selected from netlist 121 for matching based upon their being identified in Table 1 as matched devices. Note that, while the examples provided herein may relate to one or more databases of a design repository, the examples are not meant to be limiting, and the method is suitably performed upon any database of a design file, and at any stage of the design process. A match record corresponding to the devices to be matched is identified for matching in block 704. For example, match record 1 in Table 1 can be selected for matching. A select feature is identified for matching in block 706. For example, the gate areas of devices 510 and 520 can be selected for matching based on the match record identified at 704. A ROI for the identified devices is selected for matching in block 708. The ROI can be identified based upon the match record identified at 704. The ROI can include all, or a portion of the select feature, or can be based upon a dimension surrounding the select feature. For example, the ROI can include the gates of the identified devices, as shown in match record 1 of Table 1, and the ROI can have a 0 nm dimension, indicating that the entire gate, and no more or no less, is selected for matching.

An environmental condition proximate the respective matched devices is identified to determine if a sufficient map exists between the devices. An environmental condition of the determined ROI is identified for matching in block 710. For example, the metal overlay layers are identified in match record 1 of Table 1 as the critical features used to determine if a sufficient match exists between devices. Thus, the critical features of Table 1 are also referred to as environmental conditions. In another example, a variation or a delta range in a particular parameter from design model maps 125 can be identified, such as the variation and delta range in the temperature map, as indicated in match record 3 of Table 1. The critical features of each instantiation of the devices to be matched are compared to determine if they are matched to within a critical feature tolerance in block 712. The critical feature tolerance is identified based upon the match record identified at 704. For example, devices 510 and 520 can be determined to be matched according to match record 1 of Table 1 if the area of metal overlaying the respective gates differs by less than 40 nm$^2$.

A decision is made as to whether or not the critical feature tolerance is the last critical feature tolerance for the current match record in decision block 714. If not, the "NO" branch of decision block 714 is taken, and the method returns to block 710 where another critical feature of the ROI is identified for matching. For example, as indicated by match record 2 of Table 1, the active masks can have a different critical feature tolerance in the X direction than in the Y direction. If the critical feature tolerance is the last critical feature tolerance that is to be matched, the "YES" branch of decision block 714 is taken, and a decision is made as to whether or not the selected match record is the last match record of match record table 726 in decision block 716. If not, the "NO" branch of decision block 716 is taken, and the method returns to block 704 where a next match record is identified. If the current match record is the last match record that is to be matched, the "YES" branch of decision block 716 is taken, and a decision is made as to whether or not the selected devices are the last devices to be matched in decision block 718. If not, the "NO" branch of decision block 718 is taken, and the method returns to block 702 where another pair of devices of the integrated circuit that are to be matched to each other are identified. If the currently selected devices are the last devices that are to be matched, the "YES" branch of decision block 718 is taken, and the mismatches are logged in block 720. The logged mismatches are considered in revising the design file for the identified devices in block 722, and the method ends in block 724. For example, if the comparison of an active mask identifies that the active area areas within the ROIs are different by more than 2 nm in the X-dimension, as indicated by match record 2, then the gate mask can be modified to correct the mismatch. Note that the order for blocks 714, 716 and 718 are exemplary, and that the order thereof may be changed as needed or desired. Moreover, while the illustrated flowchart shows sequential operation, the steps of the method may be performed in parallel branches, as needed or desired.

FIG. 14 illustrates an example of an input interface for a generalized parameterized cell (p-cell) 800 that can represent a particular type of device of the integrated circuit design. In particular, p-cell 800 can represent a p-cell interface for instantiating a particular device type, e.g., a fringe capacitor, a transistor, a comparator, or the like, within one or more of the databases of design repository 120. Use of p-cell 800 generally assures that all devices in the integrated circuit design that are defined using the p-cell will be laid out in a similar manner to accommodate a requested characteristic of the device in the integrated circuit design. Here, for example, p-cell 800 represents a generalized 100 pF fringe capacitor in the integrated circuit design. When an integrated circuit designer needs a 100 pF fringe capacitor in the integrated circuit design, the designer can look in a cell library (e.g., the library titled "Standard Cell") for the appropriate cell type (e.g., the cell named "100 pF Fringe Cap") and by selecting and placing p-cell 800 within the integrated circuit design, the designer can be assured that the 100 pF fringe capacitor instantiated in the integrated circuit design will be implemented in a defined manner along with other 100 pF fringe capacitors that are based upon the same p-cell. In particular, the designer can be assured that all instantiations of 100 pF fringe capacitors that are based upon p-cell 800, and that have the same p-cell options selected, will be instantiated with similar mask shapes on the mask layers used to form the fringe capacitors, and that the electrical performance of all of the instantiations will be similar to within a particular design tolerance. In another embodiment (not illustrated), a generalized p-cell represents multiple variations of a particular type of device. For example, a cell library can include a generalized p-cell for fringe capacitors, and an integrated circuit designer can provide each instantiation of the p-cell with a different capacitance value as needed or desired, to make different fringe capacitors with different capacitance values.

As illustrated, p-cell 800 includes a title block 802, a configuration block 804, and a matching block 806. Title block 802 identifies the cell library from which p-cell 800 is selected, an input for a unique cell name for each instantiation, which can be entered or modified by a designer, and a location reference (e.g., the location indicated by the "X" and "Y" fields). It is presumed for purposes of discussion, that the location reference is determined during a layout process, and defines the location of a particular instantiation of the device described by p-cell 800 on the integrated circuit design. For example, the layout of the integrated circuit can be referenced by using an X-Y coordinate system, where each device is located using a distance in an X-direction from a selected origin of the integrated circuit, and a distance in a Y-direction from the selected origin. The skilled practitioner will recognize that other ways to locate a device on an integrated circuit design can be utilized as needed or desired. Also, it will be understood that in laying out a device that is defined by p-cell 800, the device will include a particular footprint of area on the integrated circuit design, and that other information may be needed or desired to fully locate an instantiation on the integrated circuit design, including, but not limited to a width in the X-direction, a length in the Y-direction, a rotation, a scaling factor, or other information. In an alternate embodiment, the location reference can be an input field that allows a designer to manually select a location for the placement of an instantiation of the device type defined by p-cell 800, such as when locating a particular device in a selected location is needed or desired. The location information can be used by subsequent analyses to identify the location of particular device instantiations being matched.

Configuration block 804 includes an input that allows a designer to specify the metallization layers at which the fringe capacitor will be implemented. Here, based upon the selected metallization layers and the capacitance associated with the particular fringe capacitor cell, a layout tool such as P/R tool 133 determines a number of fingers that will be implemented, the length and width of the fingers, and a spacing between the fingers, each of which are reported back to the p-cell. The skilled artisan will recognize that other parameters may be needed or desired to instantiate a fringe capacitor in an integrated circuit design. Also, other types of devices may have different input available to designers to specify how such a device is laid out on an integrated circuit design. For example, a transistor can be specified by a designer providing information to the inputs that specifying a channel width, a channel length, a number of contacts, a contact-to-gate spacing, a width of metal contacts, or another parameter, as needed or desired. In another example, a resistor can be specified in terms of a layer, a length, a width, a number of squares used, or another parameter, as needed or desired. In an alternate embodiment (not illustrated), configuration block 804 includes inputs that can be used by a designer for the definition of the number of fingers that will be implemented, the length and width of the fingers, and a spacing between the fingers, or other parameters, as needed or desired.

Matching block 806 includes inputs that specify whether or not a particular instantiation of the device defined by p-cell 800 is to be matched to a different instantiation of the p-cell, for example, with a YES/NO selector that can be chosen by a designer. If the instantiation is to be matched to a different instantiation, then matching block 806 provides additional inputs related to determining the matching of the instantiations. For example, the designer can input the cell name of the partner cell to be matched, and a matching tolerance for the electrical performance of the instantiations. Matching block 806 also includes the target value of the electrical performance characteristic to be matched. In this case, the target electrical performance characteristic is the capacitance of p-cell 800, e.g., 100 pF. In an alternate embodiment, the instantiation of a particular device can be matched to a target, which could be an input of the p-cell (not shown) provided by the designer. Matching block 806 also includes an evaluated value of the electrical performance characteristic for the instantiation, based upon the matching operations as described above, or based upon other operations. In other alternate embodiments, the target cell may be matched to more than one partner cells.

In a particular embodiment (not illustrated), an input is provided that allows a designer to select for matching an instantiation of the device defined by p-cell 800 to an instantiation of a device defined by a different generalized p-cell, such as a 50 pF fringe capacitor p-cell. Here, the matching tolerance input can define a difference between the values of the electrical performance characteristics or a ratio or percentage between the electrical performance characteristics, as needed or desired. In another embodiment (not illustrated), an input is provided that allows a designer to select for matching an instantiation of the device defined by p-cell 800 with just the target value, and not to match the instantiation with another instantiation.

Figure 16:
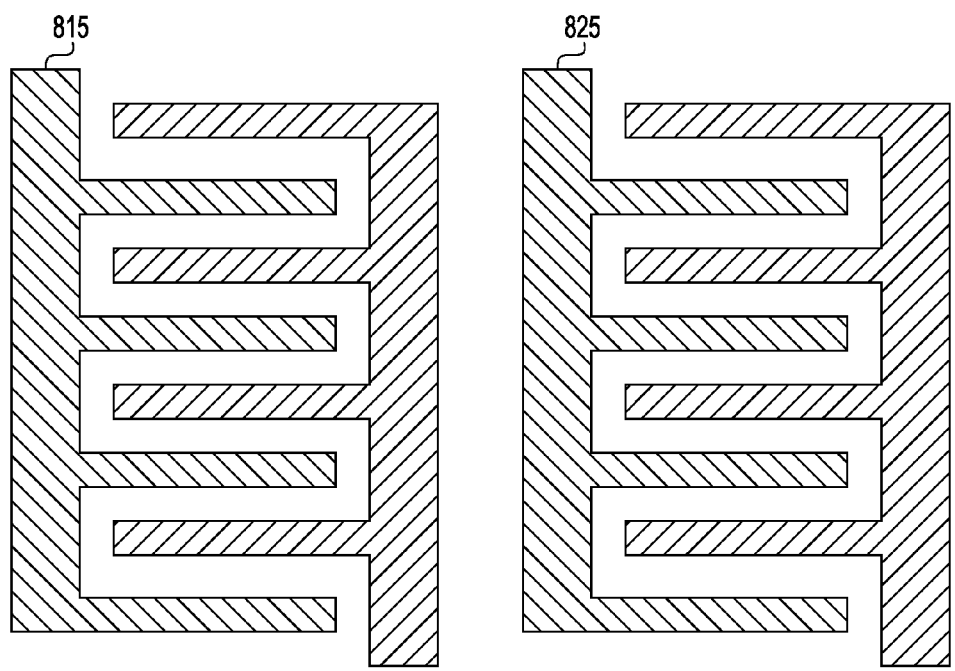
FIG. 16 is a layout view of a pair of devices defined by the p-cell instantiations of FIG. 15.

FIG. 15 illustrates p-cell instantiations 810 and 820 of p-cell 800 after the operation of a layout tool such as P/R tool 133. P-cell instantiation 810 represents a first instantiation of a 100 pF fringe capacitor named "100pF_FCap-1," and is located in the integrated circuit design at an X-Y coordinate location of (75, 235), as indicated by the location reference of p-cell instantiation 810. P-cell instantiation 820 represents a second instantiation of a 100 pF fringe capacitor named "100pF_FCap-2," and is located in the integrated circuit design at an X-Y coordinate location of (327, 150), as indicated by the location reference of p-cell instantiation 820. Each of p-cell instantiations 810 and 820 are laid out on the integrated circuit design based upon the same configuration information. FIG. 16 illustrates the devices represented by p-cell instantiations 810 and 820. For example, p-cell instantiation 810 is laid out on the integrated circuit design as device 815, a fringe capacitor defined in metal layers 1 and 5, with four fingers each of 4 micrometers (um) length and 0.12 um width, and that are separated by 0.12 um. P-cell instantiation 820 is laid out on the integrated circuit design as device 825, with features similar to device 815. P-cell instantiations 810 and 820 are intended to be matched to each other, as is indicated by the fact that "100pF_FCap-2" is indicated as the partner cell to p-cell instantiation 810, and that "100pF_FCap-1" is indicated as the partner cell to p-cell instantiation 820. Both of p-cell instantiations 810 and 820 have target capacitances of 100 pF.

At this point, a mismatch analysis is performed on the devices corresponding to p-cell instantiations 810 and 820 to determine if their electrical performance characteristics match within the desired matching tolerance. According to one embodiment, an analysis similar to that described above can be performed by first generating a match table containing entries commensurate with the information provided by the designer in the p-cells. For example, p-cell instantiations 810 and 820 can be used to generate mismatch lookup table 143 having one or more match table records that identify the cells named 100pF_FCap-1 and 100pF_FCap-2 as matched devices, along with corresponding and critical feature tolerances. It will be appreciated that the content of a particular record can vary depending upon the desired matching tolerance. According to one embodiment, particular matching requirements, such as those indicated at match table records, will be predetermined for a particular device, and selected based upon a desired matching tolerance indicated in a corresponding p-cell instantiation. It will be appreciated that according to other embodiments, analyses other than those described above can be performed in order to determine the level of mismatch between devices. For example detailed SPICE simulations or other types of simulation can be performed in order to determine a level of matching between devices. It will further be appreciated, that while evaluated capacitance values are indicated in FIG. 22, that, in the particular embodiment described above, it is not necessary that the actual capacitance be determined, only whether or not it is likely that the devices will match.

According to an embodiment, in analyzing ROIs that correspond to the locations of p-cell instantiations 810 and 820, comparator 142 can determine that the inter-layer dielectric (ILD) thickness in the area of device 815 is thicker than the ILD thickness in the area of device 825, such as based upon a design model map. Comparator 142 can further determine that, given the evaluated capacitance of device 815 (i.e., 96 pF), as compared to the evaluated capacitance of device 825 (i.e., 104 pF), that the devices are not guaranteed to match to within the matching tolerance (e.g., 5%). As such, a match status field in p-cell instantiations 810 and 820 indicates that the electrical performance characteristics of device 815 is −7.7% different from device 825, and that device 825 is +8.3% different from device 815, and that the devices are therefore mismatched relative to the desired matching tolerance. In a particular embodiment, the matching tolerance can be expressed as something other than a percentage. For example, in the case of a fringe capacitor, the matching tolerance can be expressed as a capacitance, such as +/−5 pF. In this case, the match status would be expressed as being −8 pF and +8 pF for devices 815 and 825, respectively. In yet another embodiment, the matching tolerance may be expressed as a ratio.

Returning to FIG. 1, feature adjustment module 144 operates to change one or more of the dimensions defined by either or both of p-cell instantiations 810 and 820, in order to improve the match of the electrical performance characteristics of devices 815 and 825. Here, upon evaluating the sources of variation between devices 815 and 825 and upon determining that the devices are not matched to within the matching tolerance, the mismatch information is provided to feature adjustment module 144, which selects one or more particular feature of one of the p-cell instantiations 810 or 820, and adjusts a dimension associated with that feature, in order to change the electrical performance characteristic of the selected device with respect to the other device. According to an embodiment, feature adjustment module 144 uses adjustment lookup table 145 to determine which feature of p-cell instantiations 810 and 820 to adjust. For example, adjustment lookup table 145 includes records corresponding to device types that are to be matched, and identifies the features of the device types that can be changed. In one embodiment, the adjustment table 145 includes information indicating a fixed order that features are to be adjusted, such that that the first in order feature type is modified to the extent possible before modifying a second in order feature type, if necessary. In an alternate embodiment, the adjustment table 145 indicates a set of features of the device type that are to be modified concurrently to adjust performance of the match device, such that a performance modification is spread more equally across multiple features of the device design. In a particular embodiment, feature adjustment module 144 operates to change dimension features that are not defined by inputs to p-cell instantiations 810 or 820. For example, feature adjustment module 144 can select a single finger of one or both of p-cell instantiations 810 and 820 to be lengthened or shortened, or can change the finger width or finger spacing of a single finger of the associated devices. In another embodiment, the feature adjustment module can change a p-cell input value and subsequently request that the place and route tools be re-run to effectuation the changes indicated at the p-cell inputs.

Table 2, below provides an example of adjustment lookup table 145. Here, for example, the device types that can be matched include fringe capacitors, transistors, and resistors. For each device type, a list of features is provided that will have varying effects on the electrical performance of the device type. Each can have minimum/maximum effects that can be indicated. For example, for fringe capacitors, there can be information (not illustrated) associated with the metal stack entry of Table 2 that indicates a minimum performance adjustment that can be obtained by changing the selected metal stack layers, and information that indicates a maximum performance adjustment that can be obtained by changing the metal stack layers. Based upon this information, the feature adjustment module can determine which one or more features of an instantiation to adjust to effectuate a desired performance adjustment. According to an embodiment, features to the left side of Table 2 have a greater possible maximum effect on an instantiation's performance than features towards the right side of Table 2. For example, changing the metal stack configuration can have a larger effect on the capacitance of a fringe capacitor than the features of Table 2 to the right of the metal stack entry. Thus, changing the number of fingers can have a somewhat less large effect, changing the finger length can have a still smaller effect, changing the finger spacing can have a still smaller, and changing the finger width can have the smallest effect. It will be appreciated that the adjustment lookup table of Table 2 could contain additional entries to quantify the amount of effect changing a particular will have on the overall electrical performance of the device as described in greater detail below.

TABLE 2

Adjustment lookup table

| Device | Adjustment Feature | | | | |
|---|---|---|---|---|---|
| Fringe Cap | Metal Stack | Number of Fingers | Finger Length | Finger Spacing | Finger Width |
| Transistor | Channel Width | Channel Length | Number of Contacts | Contact/Gate Spacing | Contact Width |
| Resistor | Width | | Length | | Number of Squares |

The skilled artisan will recognize that the devices shown in Table 2 are examples of device types in an integrated circuit design that can have their electrical performance characteristics matched. Further, it will be understood that each device type can have more than one entry depending upon the electrical performance characteristic being matched, e.g., for each of the different electrical performance characteristics a different set of features of the device can be adjusted to change the electrical performance of the device. For example, electrical performance characteristics for a transistor can include a turn-on voltage, a turn-off voltage, a switching current, or another electrical performance characteristic.

In a particular embodiment, feature adjustment module 144 determines the features to be adjusted based upon an amount of change needed to obtain a match between instantiations. For example, adjustment lookup table 145 can include adjustment factors that relate changes to a particular feature to a percentage change in the resulting electrical performance characteristic. For example, changing the metal stack for a fringe capacitor may result in a 20% increase in the capacitance of the adjusted fringe capacitor, and a particular reduction in the finger spacing of the fringe capacitor by 0.03 um may result in a 1% increase in the capacitance. Thus, feature adjustment module 144 can determine which feature to adjust, and the amount to adjust the feature based upon the amount of change in the electrical performance characteristic that is needed to match the device instantiations being matched in order to change as few features as possible. In an alternate embodiment, feature adjustment module 144 performs the adjustments in an iterative process, where successive adjustments to a first feature dimension are performed until a limit to which the feature can be adjusted, which can be defined by a design rule is reached. If further adjustment is needed to improve the match between device instantiations to within the matching tolerance, a next feature, as identified by the adjustment look-up table, is identified and adjusted to further improve the match. For example, feature adjustment module 144 can select to adjust a first feature up to an adjustment limit, and then, if the electrical performance characteristic is still not within the matching tolerance, the feature adjustment module can select to adjust a second feature, and so on, until the electrical performance characteristic is within the matching tolerance.

In another example, feature adjustment module 144 can select to adjust several features simultaneously until the electrical performance characteristic is within the matching tolerance. In another embodiment, feature adjustment module 144 gives priority to the adjustment of dimensions that can be done without resulting in a change to the footprint of the adjusted device. For example, adjusting only a fringe capacitor finger width while keeping the finger spacing unchanged would result in a changed footprint for the adjusted fringe capacitor. As such, feature adjustment module 144 can operate to adjust both the finger width and the finger spacing in the same iteration, in order to keep the footprint constant. In a particular embodiment, feature adjustment module 144 changes the features or dimensions by directly manipulating the features or dimensions as represented within one or more of the design databases, such as within design layout 122.

In particular, Table 2 can include a quantitative adjustment factor (not shown) for each feature that describes an amount of change in the quantity of the electrical performance characteristic that is expected for a given change in a dimension of the feature. For example, considering the fringe capacitor, adjustment lookup table 145 can include an adjustment factor for the metal stack that indicates that forming the fringe capacitor between one less metal layer can result in a 25-35% increase in the capacitance of the fringe capacitor. Similarly, adjustment lookup table 145 can include an adjustment factor for the number of fingers that indicates that forming the fringe capacitor with a different number of fingers can result in a change in the capacitance of the fringe capacitor as shown in Equation 1:

$$C_{NEW} = C_{old}\left(1 + \frac{F_{NEW} - F_{OLD}}{F_{OLD}}\right); \quad \text{Equation 1}$$

where $C_{NEW}$ is the adjusted capacitance, $C_{OLD}$ is the original capacitance, $F_{NEW}$ is the adjusted number of fingers, and $F_{OLD}$ is the original number of fingers. Thus, if a fringe capacitor as originally instantiated had a capacitance of 100 pF, and had ten fingers, and the feature adjustment module added one finger, then the new capacitance would be 110 pF. Moreover, adjustment lookup table 145 can include an adjustment factor for the finger length that indicates that forming the fringe capacitor with a different finger length can result in a change in the capacitance of the fringe capacitor as shown in Equation 2:

$$C_{NEW} = C_{old}\left(1 + \frac{L_{NEW} - L_{OLD}}{L_{OLD}}\right); \quad \text{Equation 2}$$

where $L_{NEW}$ is the adjusted finger length, and $L_{OLD}$ is the original finger length. Thus, if a fringe capacitor as originally instantiated had a capacitance of 100 pF, and had 500 μm fingers, and the feature adjustment module changed the finger length to 475 μm, then the new capacitance would be 95 pF. The skilled artisan will understand that finger spacing and finger width can similarly include quantitative adjustment factors that are smaller than the adjustment factors for metal stack, number of fingers, and finger length.

In a particular embodiment, feature adjustment module 144 correlates the adjustments to each dimension based upon the degree to which the instantiations are mismatched, and the adjustment factors. For example, the fringe capacitor represented by p-cell instantiation 810 has an evaluated capacitance of 96 pF, and is mismatched by −7.7%. As such, feature adjustment module 144 can determine that changing either the metal stack, (adjustment factor of 25%), or changing the number of fingers (adjustment factor of 25%) would result in too large a change in the capacitance of p-cell instantiation 810, but that increasing the finger width and decreasing the finger spacing would result in an appropriate amount of change in the capacitance. In another embodiment, feature adjustment module 144 correlates the adjustments to each dimension based upon more than one adjustment factor, and changes more than one associated dimension or feature. For example, feature adjustment module 144 can change both the finger spacing and the finger width of a fringe capacitor in order to maintain the footprint of a fringe capacitor, and can combine the adjustment factors for both finger spacing and finger width to predict a value of the electrical performance characteristic based upon the changes.

Figure 18:
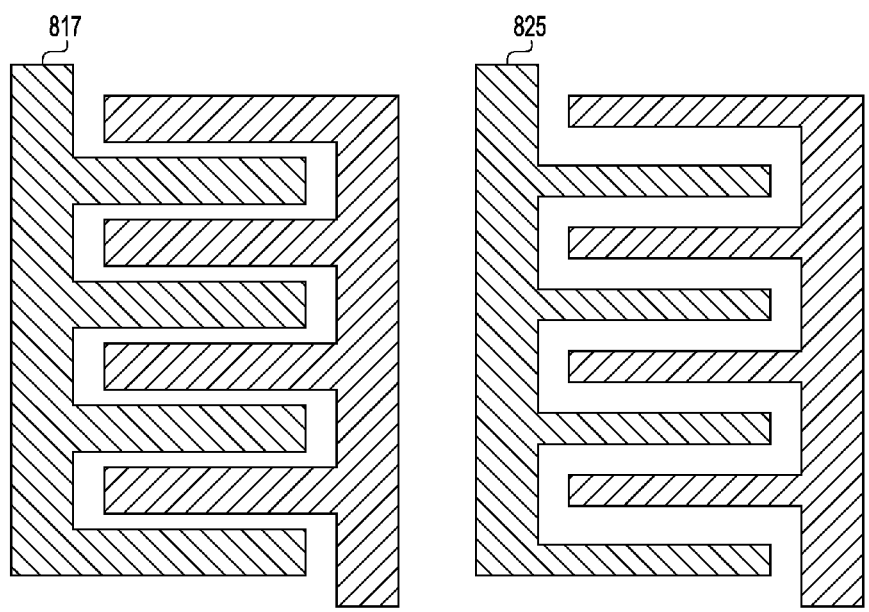
FIG. 18 is a layout view of the adjusted pair of devices of FIG. 16.

FIG. 17 illustrates p-cell instantiations 812 and 822 that are based upon p-cell instantiations 810 and 820, respectively, to reflect that feature adjustment module 144 has modified the layout of the device corresponding to p-cell instantiation 810 to have an increased the finger width of 0.18 um and a decreased finger spacing of 0.06 um, thereby increasing the capacitance of 100pF_FCap-1 to 98 pF. FIG. 18 illustrates the layout of devices represented by p-cell instantiations 812 and 822. For example, p-cell instantiation 812 is laid out on the same integrated circuit design as device 817. Note that p-cell instantiation 822 is still laid out on the integrated circuit design as device 825, because none of the features in p-cell instantiation 822 have been adjusted by feature adjustment module 144. The mismatch analysis is performed again on p-cell instantiations 812 and 822 to determine if the electrical performance characteristics of the devices match to within the matching tolerance. As such, feature adjustment module 144 determines that the devices are still not matched to within the matching tolerance (i.e., 5%). As such, a match status field in p-cell instantiations 812 and 822 indicates that the electrical performance characteristics of device 817 is −5.8% different from device 825, and that device 825 is +6.1% different from device 817, and that the devices are therefore mismatched.

Figure 20:
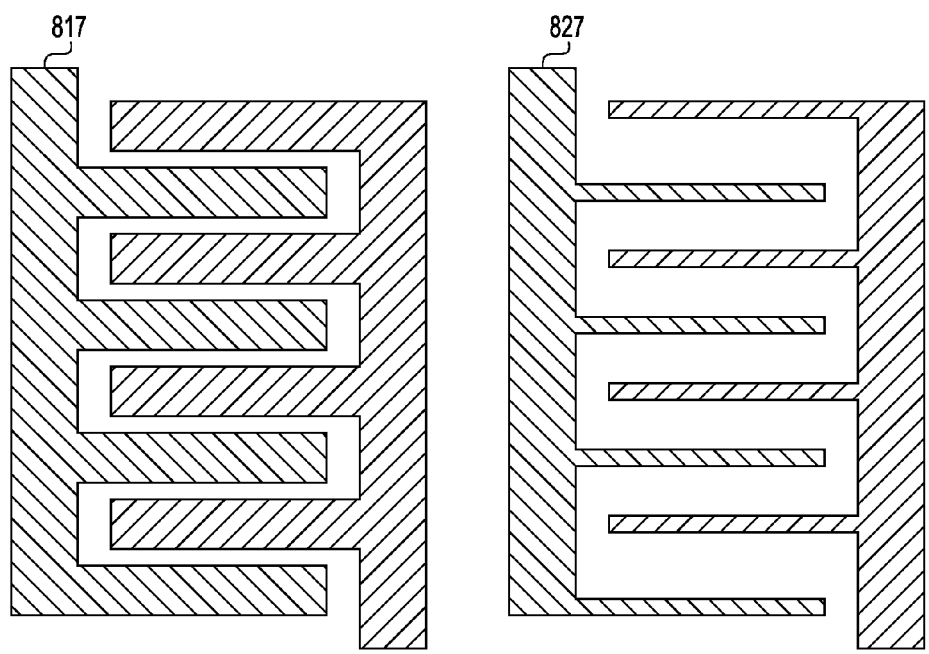
FIG. 20 is a layout view of the adjusted pair of devices of FIG. 18.

FIG. 19 illustrates p-cell instantiations 814 and 824 that are based upon p-cell instantiations 812 and 822, respectively, where feature adjustment module 144 has operated on p-cell instantiation 822 to decrease the finger width to 0.06 um and to increase the finger spacing to 0.18 um, thereby reducing the capacitance of 100pF_FCap-2 to 101 pF. FIG. 20 illustrates the devices represented by p-cell instantiations 814 and 824. For example, p-cell instantiation 824 is laid out on the same integrated circuit design as device 827. Note that the p-cell instantiation 814 is still laid out on the integrated circuit design as device 817, because none of the features in p-cell instantiation 814 were adjusted by feature adjustment module 144 in this iteration. The mismatch analysis is performed again on p-cell instantiations 814 and 824 to determine if the electrical performance characteristics of the devices match to within the matching tolerance. As such, feature adjustment module 144 determines that the devices are now matched to within the matching tolerance. As such, a match status field in p-cell instantiations 814 and 824 indicates that the electrical performance characteristics of device 817 is −3.0% different from device 827, and that device 827 is +3.0% different from device 817, and that the devices are therefore matched.

Note that the matching of devices as illustrated above was described such that the devices were matched to a particular electrical performance characteristic (i.e., 100 pF), and also to each other (i.e., the matching tolerance of 5%). The skilled artisan will recognize that the matching of devices can be performed based upon an absolute match to a target value, based upon a relative match of the devices, or both, as needed or desired. For example, the electrical performance of a first circuit may depend on a pair of capacitors matching to a 100 pF target capacitance. Thus, if after analyzing the capacitors based upon the sources of variation, it is determined that one of the capacitors has an actual capacitance of 85 pF and the other has an actual capacitance of 100 pF, it would be necessary to adjust only the 85 pF capacitor to be as close to 100 pF as possible. In a second circuit it may be less important that a pair of capacitors match a 100 pF target, but rather that the pair of capacitors are matched to each other to within a target percentage. Here, if after analyzing the capacitors based upon the sources of variation, it is determined that one of the capacitors has an actual capacitance of 85 pF and the other has an actual capacitance of 100 pF, it may be possible to adjust both capacitors to match at some intermediate value (e.g., 90 pF).

In a particular embodiment, feature adjustment module 144 operates to change one or more of the dimensions defined by a single p-cell instantiation, in order to improve the match of an electrical performance characteristic of an associated device. Here, upon evaluating the sources of variation affecting the device and determining that the electrical performance characteristic of the device does not have a value that is within a matching tolerance, feature adjustment module 144 selects a particular feature of the p-cell instantiation, and adjusts a dimension associated with that feature, in order to change the electrical performance characteristic of the device to be within the matching tolerance. Feature adjustment module 144 uses adjustment lookup table 145 to determine which feature of the p-cell instantiation to adjust, and how much to adjust the selected feature. The skilled artisan will recognize that the operation of feature adjustment module 144 need not be limited to changes to p-cell instantiations, but that feature adjustment module 144 can also perform the same or similar operations on one or more of the device design files described above, such as design repository 120.

Figure 21:
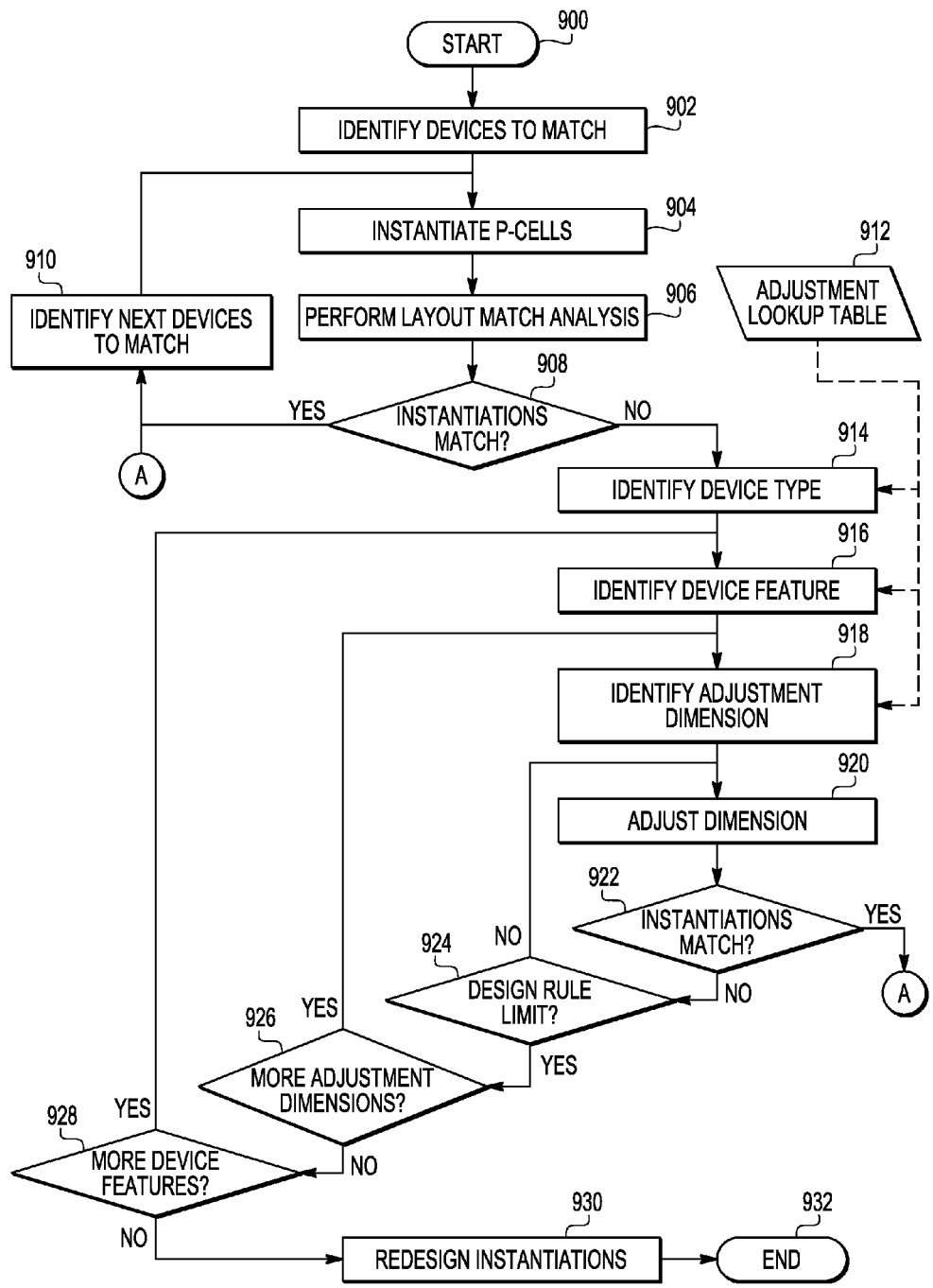
FIG. 21 is a flow diagram illustrating a method for matching electrical performance characteristics of elements of a fabricated integrated circuit in accordance with a specific embodiment of the present disclosure.

FIG. 21 illustrates an embodiment of a method for matching the electrical performance characteristics of elements of a fabricated integrated circuit, starting at block 900. Devices in an integrated circuit design that are to be matched are identified in block 902. For example, a pair of fringe capacitors in netlist 121 can be identified in their respective p-cells as needing to have their electrical performance characteristics matched. The devices are placed and routed in block 904. A layout mismatch analysis is performed on the identified devices in block 906. The analysis can include the method steps in FIG. 13, described above. A decision is made as to whether or not the device instantiations are matched to within a matching tolerance in decision block 908. If so, the "YES" branch of decision block 908 is taken, a next pair of devices in the integrated circuit design that are to be matched are identified in block 910, and the method returns to block 904 where the new devices are instantiated in the appropriate p-cells.

If the device instantiations are not matched to within the matching tolerance, the "NO" branch of decision block 908 is taken, and a device type for the device instantiations is identified in block 914. The device types that can be matched are determined from an adjustment lookup table 912. For example, feature adjustment module 144 can select an entry associated with fringe capacitors from a list of devices included in adjustment lookup table 145. A feature of the device type is identified in block 916. The feature is determined from adjustment lookup table 912. For example, feature adjustment module 144 can select fringe capacitor fingers from the entry associated with fringe capacitors from adjustment lookup table 145. A dimension to be adjusted is identified in block 918. The dimension is determined from adjustment lookup table 912. For example, feature adjustment module 144 can select finger width or finger spacing from the entry associated with fringe capacitors from adjustment lookup table 145. The dimension is adjusted in block 920. For example, feature adjustment module 144 can adjust the finger width and finger separation of one of the p-cell instantiations 810 or 820 in order to improve the match of the electrical performance characteristics of devices 815 and 825.

A decision is made as to whether or not the electrical performance characteristics of the devices are matched as a result of the adjustment in decision block 922. If so, the "YES" branch of decision block 922 is taken and the method returns to block 910 where a next pair of devices in the integrated circuit design that are to be matched are identified. If the electrical performance characteristics of the devices are not matched, the "NO" branch of decision block 922 is taken and a decision is made as to whether or not further adjustment to the dimension would violate a design rule limit in decision block 924. If not, the "NO" branch of decision block 924 is taken and the method returns to block 920 where the dimension is re-adjusted. If further adjustment to the dimension would violate the design rule limit, the "YES" branch of decision block 924 is taken and a decision is made as to whether or not another dimension of the identified feature is available to be adjusted in decision block 926. If so, the "YES" branch of decision block 926 is taken and the method returns to block 918 where another dimension to be adjusted is identified. If another dimension of the identified feature is not available to be adjusted, the "NO" branch of decision block 926 is taken and a decision is made as to whether or not another feature is available to be adjusted in decision block 928. If so, the "YES" branch of decision block 928 is taken and the method returns to block 916 where another feature of the device type is identified. If another feature is not available to be adjusted, the "NO" branch of decision block 928 is taken, the instantiations are redesigned in block 930, and the method ends in block 932. While the method described above provides for sequentially identifying device features and adjustment dimensions, and the successive adjustment of the dimensions, it will be understood that more than one device feature and more than one adjustment dimension of each feature can be adjusted at the same time, as needed or desired.

FIG. 22 illustrates an embodiment where feature adjustment module 144 makes changes to input fields of p-cell instantiations 1010 and 1020 in order to obtain a better match between the devices formed by the p-cells. Thus, having evaluated the value of the electrical performance characteristic for the instantiations, based upon the matching operations described above, feature adjustment module 144 determines a new target value for the electrical performance characteristic in p-cells 1010 and 1020. For example, using p-cell instantiations 810 and 820, feature adjustment module 144 determines that the evaluated capacitance for p-cell instantiation 810 was 96 pF, and so the feature adjustment module sets the target capacitance in p-cell 1010 to 104 pF to compensate, and the features of the fringe capacitor are adjusted based upon the new target capacitance. Here, the electrical performance characteristic can be re-evaluated to better ensure that the instantiations match. Similarly, feature adjustment module 144 determines that the evaluated capacitance for p-cell instantiation 820 was 104 pF, and so the feature adjustment module sets the target capacitance in p-cell 1020 to 96 pF to compensate, and the features of the fringe capacitor are adjusted based upon the new target capacitance. As a result of changing the target capacitance of instantiation p-cells 1010 and 1020, the devices are matched to within the matching tolerance. FIG. 23 illustrates an embodiment of a method for matching electrical performance characteristics of elements of a fabricated integrated circuit, beginning at block 1100 where a pair of instantiations have been evaluated and the instantiations have been determined to not match to within a matching tolerance for the instantiations. A feature adjustment module receives the evaluated value of the electrical performance characteristic for the instantiations, and based upon the mismatch, can change the target value for the electrical performance characteristic of the instantiations in block 1102. A decision is made as to whether the resulting instantiations are matched in decision block 1104. If not, the method returns to block 1102, where the feature adjustment module changes the target value of the electrical performance characteristic for the instantiations. If the resulting instantiations are matched the "NO" branch of decision block 1104 is taken and the method ends in block 1106.

Figure 24:
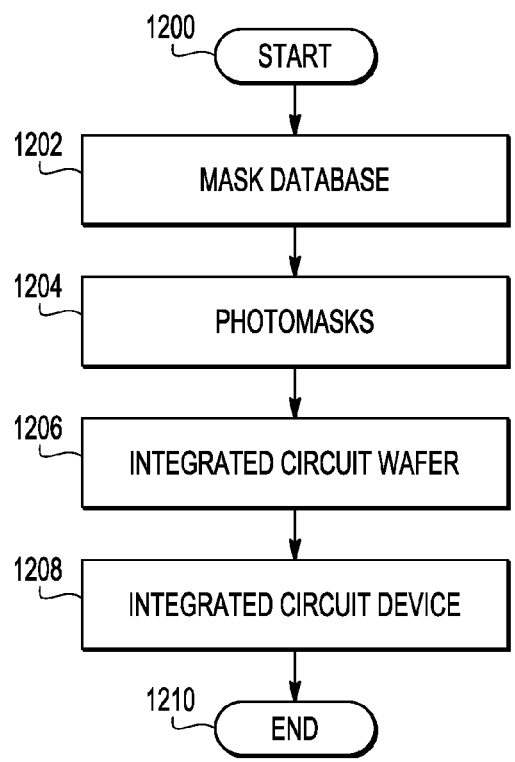
FIG. 24 is a flow diagram illustrating another method in accordance with a specific embodiment of the present disclosure.

FIG. 24 illustrates an embodiment of a method for fabricating integrated circuit devices, starting at block 1200. At block 1202, information included at a mask database is provided to a photo-lithography mask manufacturing facility. The method proceeds to block 1204 where photomasks are manufactured and provided to an integrated circuit wafer-fabrication facility. The method proceeds to block 1206 where an integrated circuit wafer is manufactured using the photo-masks. The method proceeds to block 1208 where integrated circuit devices are manufactured from integrated circuit die included at the integrated circuit wafer, and the method ends at block 1210.

Figure 25:
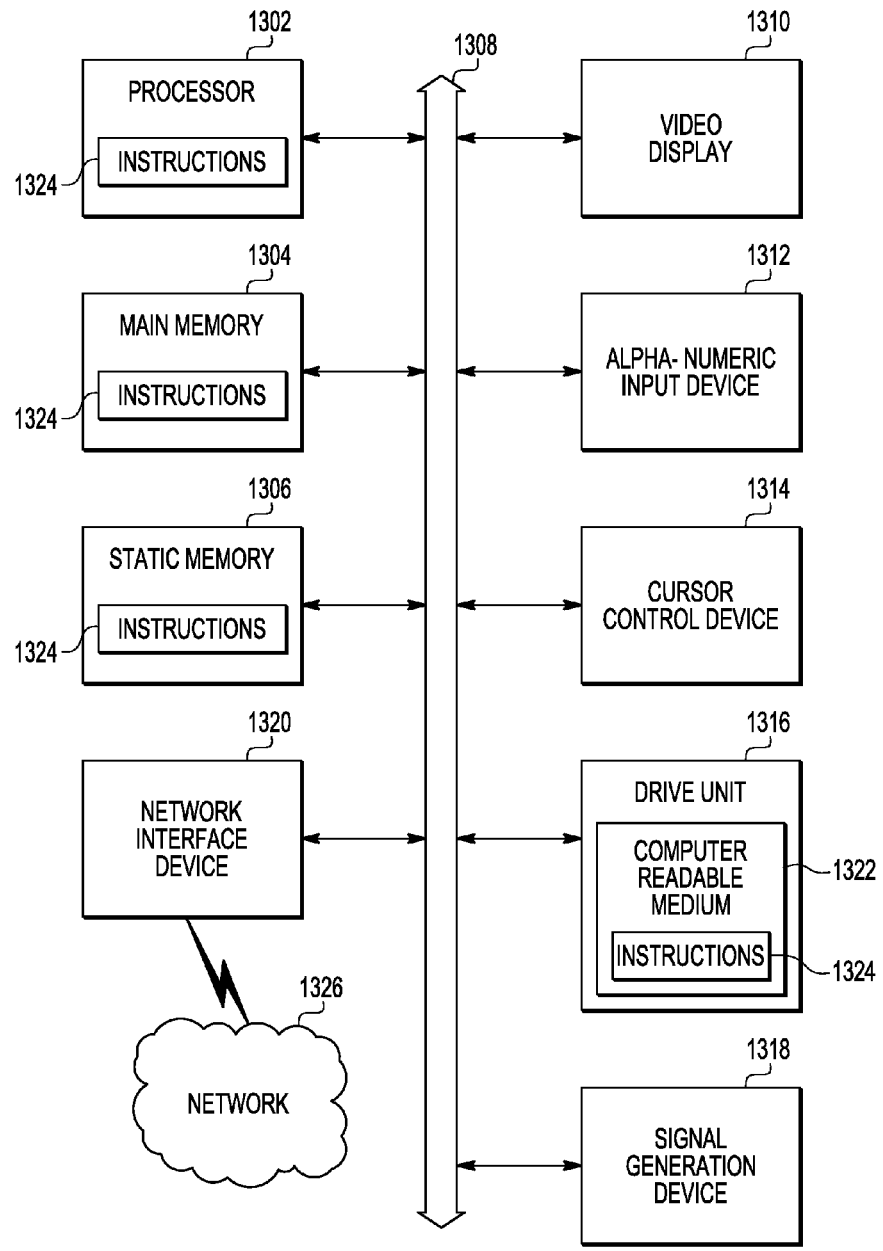
FIG. 25 is a block diagram of a processing system in accordance with at least one embodiment of the present disclosure.

FIG. 25 is a block diagram of a data processing system 1300 in accordance with at least one embodiment of the present disclosure. Processing system 1300 can include a set of instructions that can be executed to manipulate processing system 1300 to perform any one or more of the methods or functions disclosed above. Processing system 1300 may operate as a standalone device or may be connected, e.g., using a network, to other processing systems or peripheral devices.

In a networked deployment, processing system 1300 may operate in the capacity of a server or as a client user computer in a server-client user network environment, or as a peer processing system in a peer-to-peer (or distributed) network environment. Further, while a single processing system 1300 is illustrated, the term "system" shall also be taken to include any collection of systems or sub-systems that individually or jointly execute a set, or multiple sets, of instructions to perform one or more computer functions.

Processing system 1300 may include one or more processors 1302, e.g., a central processing unit (CPU), a graphics processing unit (GPU), or both. Moreover, processing system 1300 can include a main memory 1304 and a static memory 1306 that can communicate with each other via a bus 1308. As shown, processing system 1300 may further include a video display unit 1310, such as a liquid crystal display (LCD), an organic light emitting diode (OLED), a flat panel display, a solid state display, or a cathode ray tube (CRT). Additionally, processing system 1300 may include an input device 1312, such as a keyboard, and a cursor control device 1314, such as a mouse. Processing system 1300 can also include a disk drive unit 1316, a signal generation device 1318, such as a speaker, and a network interface device 1320.

In a particular embodiment, disk drive unit 1316 may include a computer readable medium 1322 in which one or more sets of instructions 1324, e.g. software, can be embedded. Further, instructions 1324 may embody one or more of the methods or logic as described herein. In a particular embodiment, instructions 1324 may reside completely, or at least partially, within main memory 1304, static memory 1306, and/or within processor 1302 during execution by processing system 1300. Main memory 1304 and processor 1302 also may include computer readable media. Network interface device 1320 can provide connectivity to a network 1326, e.g., a wide area network (WAN), a local area network (LAN), or other network.

In accordance with various embodiments of the present disclosure, the methods described herein may be implemented, in whole or in part, by software programs executable by processing system 1300. The present disclosure contemplates a computer readable storage device (e.g., main memory 1304, static memory 1306, or drive unit 1316) that includes instructions 1324 or receives and provides instructions 1324 for execution. Further data representative of an integrated circuit design can be stored in one or more of the computer readable storage devices for access by processing system 1300 during execution of instructions 1324 so as to implement the methods described above.

While the computer readable storage device is shown to be a single storage device, the term "computer readable storage device" includes a single storage device or multiple storage devices, such as a centralized or distributed database, and/or associated caches and servers that store one or more sets of instructions. The term "computer readable storage device" shall also include any storage device that is capable of storing a set of instructions for execution by a processor or that causes a processing system to perform any one or more of the methods or operations disclosed herein.

In a particular non-limiting, exemplary embodiment, the computer readable storage device can include a solid-state memory such as a memory card or other package that houses one or more non-volatile read-only memories. Further, the computer readable storage device can be a random access memory or other volatile re-writeable memory. Additionally, the computer readable storage device can include a magneto-optical or optical medium, such as a disk or tapes or other storage device. A non-transitory computer readable storage device comprises all computer readable storage devices except for a transitory propagating signal.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and processing systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In this document, relational terms such as "first" and "second", and the like, may be used solely to distinguish one entity or action from another entity or action without necessarily requiring or implying any actual relationship or order between such entities or actions or any actual relationship or order between such entities and claimed elements. The term "another", as used herein, is defined as at least a second or more. The terms "including," "having" or any variation thereof, as used herein, are defined as comprising. The terms "integrated circuit," "device," "component," "feature," or any variations thereof, as used herein, are understood to be devices.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
    identifying at a data processing computer a first instantiation of a device design of an integrated circuit and a second instantiation of the device design of the integrated circuit as matched devices, wherein the first instantiation and the second instantiation each include respective layout features corresponding to a set of layout features, including a first layout feature, wherein the first instantiation includes an instantiation of the first layout feature and the second instantiation includes an instantiation of the first layout feature;
    determining a region of interest (ROI) of the first instantiation based upon the first layout feature of the first instantiation;
    determining a region of interest (ROI) of the second instantiation based upon the first layout feature of the second instantiation;
    determining that a performance mismatch is to occur between an electrical performance characteristic of the first instantiation and of the second instantiation based upon a difference in an environmental condition proximate the first instantiation and the environmental condition proximate the second instantiation, wherein the environmental condition is exclusive of any layout features of the first and second instantiations; and
    changing a first layout feature, of the set of layout features, of the first instantiation in response to determining that the performance mismatch exists.

2. The method of claim 1, wherein determining that the performance mismatch is to occur includes determining a difference between the environmental condition at a first region of interest (ROI) of the integrated circuit die that is based upon a dimension of the first layout feature of the first instantiation and the environmental condition at a second ROI that is based upon the dimension of the first layout feature of the second instantiation.

3. The method of claim 1 further comprising:
changing the first layout feature of the second instantiation in response to determining that the performance mismatch exists.

4. The method of claim 1, further comprising:
changing a second layout feature of the first instantiation response to determining that the performance mismatch exists.

5. The method of claim 4 further comprising:
changing the second layout feature of the second instantiation in response to determining that the performance mismatch exists.

6. The method of claim 3, wherein determining that the performance mismatch is to occur comprises
determining a difference between the first and second values; and
determining that the first instantiation matches the second instantiation when the difference is less than the tolerance.

7. The method of claim 2, wherein determining the mismatch occurs further based upon the difference does not meeting a first tolerance.

8. The method of claim 1, wherein the first instantiation and the second instantiation each conform to layout design rules of an integrated circuit die.

9. The method of claim 1, wherein the first and second instantiations are based upon a parameterized cell, and changing the first layout feature is in response to the data processing computer modifying a user input value of the parameterized cell.

10. The method of claim 1, wherein the device design is a fringe capacitor.

11. The method of claim 1, wherein the device design is a transistor.

12. The method of claim 1, wherein changing the first layout feature of the first instantiation comprises changing a dimension of the feature in a design database.

13. The method of claim 9, wherein modifying the user input value includes modifying a target value of the electrical performance characteristic.

14. A system comprising:
a memory; and
a data processor operable to execute instructions to:
identify first instantiation of a device design of an integrated circuit and a second instantiation of the device design of the integrated circuit as matched devices, wherein the first and second instantiations are based upon a parameterized cell;
determine a region of interest (ROI) of the first instantiation based upon a first layout feature of the first instantiation;
determine a region of interest (ROI) of the second instantiation based upon the first layout feature of the second instantiation;
determine that a performance mismatch is to occur between an electrical performance characteristic of the first instantiation and of the second instantiation based upon a difference in an environmental condition proximate the first instantiation and the environmental condition proximate the second instantiation, wherein the environmental condition is exclusive of any layout features of the first and second instantiations; and
change the first layout feature of the first instantiation in response to the performance mismatch existing, wherein the first instantiation and the second instantiation each include respective layout features corresponding to a set of layout features, including the first layout feature, wherein the first instantiation includes an instantiation of the first layout feature and the second instantiation includes an instantiation of the first layout feature, and wherein changing the first layout feature is in response to the system modifying a user input value of the parameterized cell.

15. The system of claim 14, wherein, in further response to the mismatch exists, the data processor is further operable to execute code to:
change a second layout feature of the second instantiation.

16. The system of claim 15, wherein, prior to determining the mismatch exists, the data processor is further operable to execute code to:
ensure the first and second instantiations meet layout design rules of the integrated circuit.

17. The system of claim 14, wherein determining that performance mismatch is to occur is based upon determining a difference between the environmental condition proximate the first instantiation and the environmental condition proximate the second instantiation does not meet a tolerance.

18. The system of claim 12, wherein in the device design is a fringe capacitor.

19. A method comprising:
identifying at a data processing computer, a device design comprising an instantiation of a device type;
identifying a layout feature of the device design;
identifying a region of the device design associated with the instantiation based on the layout feature of the instantiation;
identifying a compare feature of the device design, the compare feature comprising a plurality of features;
determining an electrical performance characteristic of the instantiation does not match a tolerance based upon a portion of the compare feature within the region;
in response to determining the instantiation does not match the tolerance, changing a layout feature of the instantiation.

20. The method of claim 19, wherein the instantiations is based upon a parameterized cell, and changing the layout features is in response to the data processing computer modifying a user input value of the parameterized cell.

* * * * *